United States Patent
Kim et al.

(10) Patent No.: US 11,448,957 B2
(45) Date of Patent: Sep. 20, 2022

(54) PELLICLE TRANSFER APPARATUS AND METHOD

(71) Applicant: SAMSUNG ELECTRONICS CO., LTD., Suwon-si (KR)

(72) Inventors: Mun Ja Kim, Hwaseong-si (KR); Changyoung Jeong, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 156 days.

(21) Appl. No.: 17/014,561

(22) Filed: Sep. 8, 2020

(65) Prior Publication Data

US 2021/0286258 A1 Sep. 16, 2021

(30) Foreign Application Priority Data

Mar. 13, 2020 (KR) ........................ 10-2020-0031411

(51) Int. Cl.
*G03F 1/66* (2012.01)
*G03F 1/62* (2012.01)
*G03F 7/20* (2006.01)

(52) U.S. Cl.
CPC ................. *G03F 1/66* (2013.01); *G03F 1/62* (2013.01); *G03F 7/70983* (2013.01)

(58) Field of Classification Search
CPC ..... G03F 1/22; G03F 1/62; G03F 1/64; G03F 1/66; G03F 1/68; G03F 1/82; G03F 7/70983; G03F 7/708; G03F 7/70808; G03F 7/70816; G03F 7/70825; G03F 7/70833; G03F 7/70841; G03F 7/70858; G03F 7/70866; G03F 7/70875; G03F 7/70908–7095; G03F 7/70975; G03F 7/70991

USPC ......... 430/5; 355/18, 30, 52–55, 67–77, 133
See application file for complete search history.

(56) References Cited

U.S. PATENT DOCUMENTS

| | | | |
|---|---|---|---|
| 8,593,783 B2 | 11/2013 | Bowers et al. | |
| 9,144,962 B2 | 9/2015 | Lee et al. | |
| 9,419,152 B2 | 8/2016 | Naito et al. | |
| 9,782,963 B2 | 10/2017 | Hong et al. | |
| 10,181,521 B2 | 1/2019 | Venegopal et al. | |
| 10,500,546 B2 | 12/2019 | Sinsabaugh et al. | |
| 2007/0169895 A1* | 7/2007 | Kobayashi | H01L 21/6836 156/707 |

(Continued)

FOREIGN PATENT DOCUMENTS

WO WO 2011/046415 A2 4/2011

*Primary Examiner* — Christina A Riddle
(74) *Attorney, Agent, or Firm* — Volentine, Whitt & Francos, PLLC

(57) ABSTRACT

A pellicle transfer apparatus includes; a base including supporting a target plate, a pellicle and a flexible plate sequentially stacked on the base, and a roller unit laterally movable in a first direction across the base and including a lower roller extending in a second direction intersecting the first direction, and an upper roller above the lower roller and extending in the second direction, wherein the lower roller compresses the flexible plate while the roller unit laterally moves in the first direction across the base to bond the pellicle to the target plate, as the pellicle is separated from the flexible plate, and the flexible plate moves upward to wrap around the lower roller, and the upper roller contacts the flexible plate as it wraps around the lower roller.

19 Claims, 21 Drawing Sheets

(56) References Cited

U.S. PATENT DOCUMENTS

| | | | |
|---|---|---|---|
| 2009/0065144 A1* | 3/2009 | Yamamoto | H01L 21/67132 |
| | | | 156/763 |
| 2012/0258311 A1* | 10/2012 | Hong | B32B 37/0053 |
| | | | 428/688 |
| 2018/0029353 A1* | 2/2018 | Kajino | B41F 16/002 |
| 2019/0061328 A1 | 2/2019 | Kim | |
| 2019/0272992 A1 | 9/2019 | Bower et al. | |
| 2019/0295866 A1* | 9/2019 | Yoshida | H05B 6/107 |
| 2020/0012204 A1* | 1/2020 | Van Der Meulen | |
| | | | G03F 7/70983 |

* cited by examiner

PELLICLE TRANSFER APPARATUS AND METHOD

CROSS-REFERENCE TO RELATED APPLICATION

This U.S. nonprovisional application claims priority under 35 U.S.C § 119 to Korean Patent Application No. 10-2020-0031411 filed on Mar. 13, 2020 in the Korean Intellectual Property Office, the subject matter of which is hereby incorporated by reference.

BACKGROUND

The inventive concept relates to pellicle transfer apparatuses and methods, and more particularly, to pellicle transfer apparatuses and methods capable of transferring a pellicle while preventing damage to the pellicle.

A pellicle is a thin film or membrane. Pellicles may be used during for many purposes during a variety of manufacturing and packaging processes. Pellicles may be used during the fabrication of semiconductor devices. For example, a pellicle may transferred (or placed) onto a photomask to protect the photomask from external contaminants (e.g., dust, resist, etc.) during a photolithography process. Pellicles used in conjunction with a photomask should exhibit high transmittance with respect to light used during the optical lithography process, insusceptibility to thermal radiation, strong mechanical strength, high uniformity, excellent durability and well-understood stability.

However, as line-widths of semiconductor devices and electronic circuits have been reduced, the wavelength(s) of light used during optical lithography process(es) has become increasing short. Hence, the development of suitable pellicles in relation to various light sources used during optical lithography process(es) has become a an area of study.

SUMMARY

Embodiments of the inventive concept provide pellicle transfer apparatuses and methods capable of transferring a pellicle without damage to the pellicle or an associated flexible plate. Embodiments of the inventive concept provide pellicle transfer apparatuses and methods capable of stably transferring a pellicle onto a hollow target plate having an empty center. Embodiments of the inventive concept provide pellicle transfer apparatuses and methods capable of increasing pellicle transfer yields.

Other objects and features of the inventive concept will become apparent to those skilled in the art upon consideration of the following written description taken together with the accompanying drawings.

According to embodiments of the inventive concept, a pellicle transfer apparatus includes; a base including a body with a disposition hole and a support member in the disposition hole, and a roller unit laterally movable in a first direction across the base, and including a lower roller extending in a second direction intersecting the first direction, and an upper roller above the lower roller and extending in the second direction.

According to embodiments of the inventive concept, a pellicle transfer apparatus includes; a base including supporting a target plate, a pellicle and a flexible plate sequentially stacked on the base, and a roller unit laterally movable in a first direction across the base and including a lower roller extending in a second direction intersecting the first direction, and an upper roller above the lower roller and extending in the second direction, wherein the lower roller compresses the flexible plate while the roller unit laterally moves in the first direction across the base to bond the pellicle to the target plate, as the pellicle is separated from the flexible plate, and the flexible plate moves upward to wrap around the lower roller and the upper roller contacts the flexible plate as it wraps around the lower roller.

According to embodiments of the inventive concept, a pellicle transfer method includes; placing a target plate on a base, placing a flexible plate having a pellicle attached to a bottom surface of the flexible plate to cover the target plate, and moving a roller unit, including a lower roller and an upper roller above the lower roller, in a first direction across the base, such that the lower roller compresses the flexible plate to bond the pellicle to the target plate, as the pellicle separates from the flexible plate and the flexible plate moves upward to wrap around the lower roller, and the upper roller contacts the flexible plate as it wraps around the lower roller.

DETAILED DESCRIPTION

Certain embodiments of the inventive concept will now be described in some additional detail with reference to the accompanying drawings.

Throughout the written description and drawings like reference numbers and labels are used to denote like or similar elements and/or features. Throughout the written description certain geometric terms may be used to highlight relative relationships between elements, components and/or features with respect to embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

The drawings, as well as corresponding references in the written description, assume an exemplary geometric layout, wherein D1 indicates a first direction, D2 indicates a second direction that intersects with first direction, and D3 indicates a third direction that intersects both the first and second directions. In this regard, the first and second directions may be understood as horizontal directions and the third direction may be understood as a vertical direction. However, these reference directions and their respective relationships are merely illustrative and the inventive concept is not limited thereto.

Figure 1:
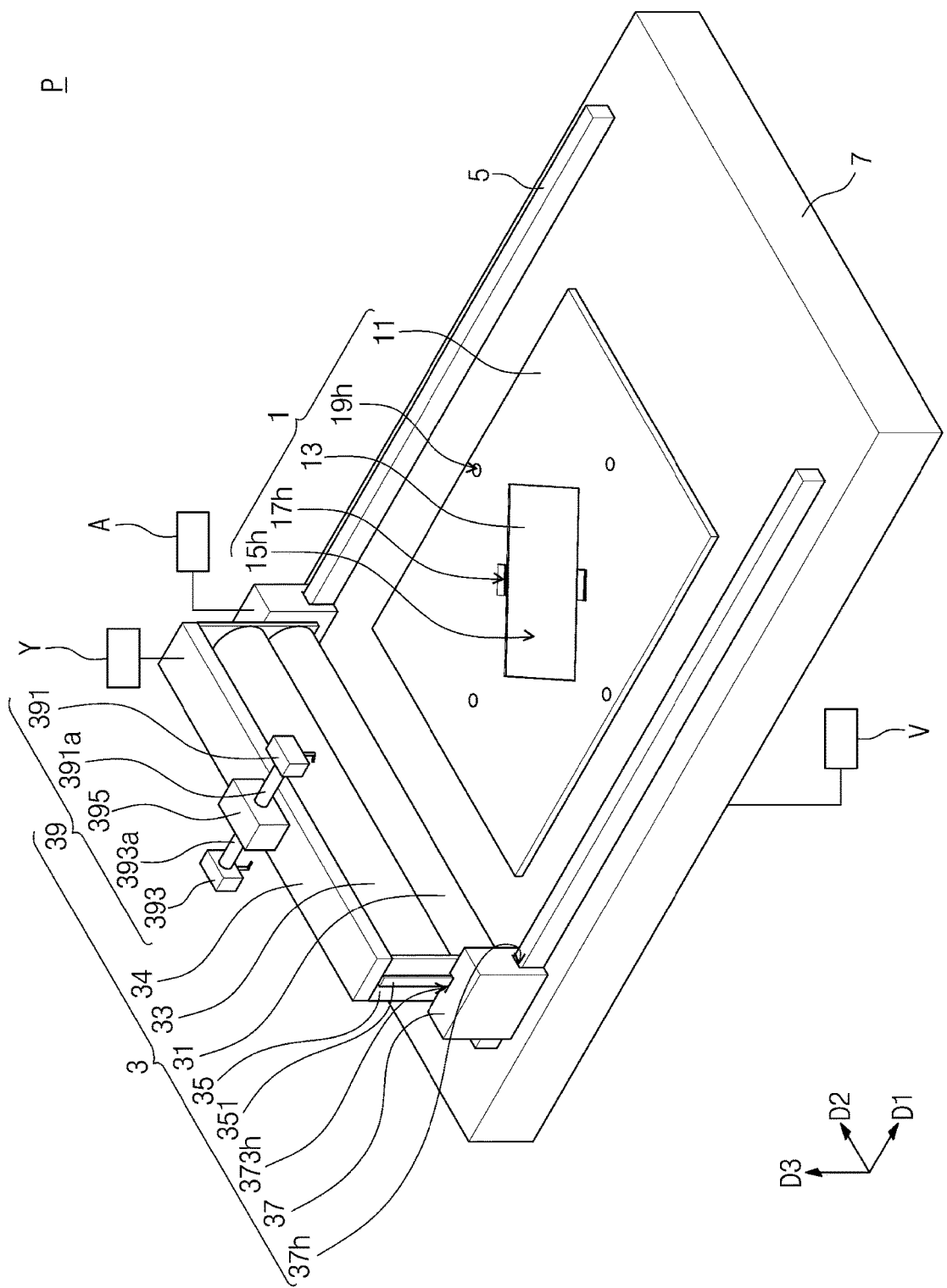
FIG. 1 is a perspective view illustrating a pellicle transfer apparatus according to embodiments of the inventive concept.

Figure (FIG.) 1 is a perspective view illustrating a pellicle transfer apparatus P according to embodiments of the inventive concept Referring to FIG. 1, the pellicle transfer apparatus P may be used to transfer (or place) a pellicle onto a particular component, feature or location. For example, the pellicle transfer apparatus P may be configured to place a pellicle onto a target plate, where the target plate may include one or more component(s), feature(s) and/or location(s).

In this regard, the target plate may be an open frame having a substantially rectangular shape with a hollowed-out center portion. Alternately, the target plate may include a full or partially-full plate surface that is uniformly flat.

As noted above, pellicle may be used for various purposes. For example, a pellicle may be used to physically or optically protect an underlying article. In one example, a pellicle may be used in conjunction with an extreme ultraviolet (EUV) exposure apparatus of the type commonly used during the fabrication of semiconductor devices. That is, a pellicle may be employed to protect an EUV exposure mask from contamination. However, as those skilled in the art will recognize, there are many different types of masks that require protection and many different types of equipment using these masks. Hereafter, the term "mask" will be generally used to denote a surface that may be protected by a pellicle. In this regard, when a pellicle is used to protect a mask, a target plate may be used to fix the pellicle to the mask.

A pellicle may be made from (or include) one or more materials. For example, when a pellicle is intended to protect an EUV exposure mask, the pellicle may include carbon. That is, the pellicle may include graphite, graphene, carbon nanotube (CNT), nano-horn, nano carbon flake, nano-crystalline graphite, amorphous carbon, diamond-like carbon (DLC), hydrocarbon), and/or graphene oxide. Alternately or additionally, the pellicle may include molybdenum (Mo), ruthenium (Ru), zirconium (Zr), zirconium carbide (ZrC), boron (B), boron carbide (BxCy), boron nitride (BN), titanium (Ti), tungsten (W), tungsten sulfide (WxSy), niobium (Nb), aluminum (Al), tin (Sn), zinc (Zn), and/or nickel (Ni).

However, those skilled in the art will recognize that a pellicle may variously include one or more materials depending on its intended use(s).

In the illustrated example of FIG. 1, the pellicle transfer apparatus P may include a base 1, a roller unit 3, a guide rail 5, a lower body 7, a drive unit A, a vertical drive unit Y, and a vacuum pump V.

The base 1 may be positioned on the lower body 7, such that the lower body 7 may support the base 1. The base 1 may include a body 11 and a support member 13. The body 11 may be shaped like a plate. For example, the body 11 may have a plate shape that extends in the first direction D1 and the second direction D2. In some embodiments, the body 11 may have a rectangular shape. The body 11 may have a flat top surface. The body 11 may include a disposition hole 15$h$, an extension hole 17$h$, and a vacuum hole 19$h$.

The disposition hole 15$h$ may be a region that is downwardly recessed by a certain thickness from the top surface of the body 11. In some embodiments, the disposition hole 15$h$ may be positioned near the center of the body 11. A target plate may be placed on the disposition hole 15$h$. (See also, FIG. 8A). The disposition hole 15$h$ may have various shapes. In some embodiments, the disposition hole 15$h$ may have a rectangular or square shape, but might alternatively have an octagonal shape, a hexagonal shape, or an oval shape. Hereafter, for convenience of description, the disposition hole 15$h$ will be assumed to have a rectangular shape. (See also, FIG. 15).

The extension hole 17$h$ may be a region that is downwardly recessed by a certain thickness from the top surface of the body 11. The extension hole 17$h$ may be positioned on a lateral surface of the support member 13. For example, the extension hole 17$h$ may be recessed outside the support member 13, while extending from the disposition hole 15$h$. The extension hole 17$h$ may be spatially connected to the disposition hole 15$h$. In some embodiments, a plurality of extension holes 17$h$ may be provided. For example, two (2) extension holes 17$h$ may be provided on opposite sides of the disposition hole 15$h$. In some embodiments, the extension hole 17$h$ may have a depth greater than that of the disposition hole 15$h$.

The vacuum hole 19$h$ may be a region that is downwardly recessed by a certain depth from the top surface of the body 11. The vacuum hole 19$h$ may be mechanically associated with the vacuum pump V, such that the vacuum hole 19$h$ applies a vacuum pressure generated by the vacuum pump V. In some embodiments, a plurality of vacuum holes 19$h$ may be provided. For example, four (4) vacuum holes 19$h$ may be positioned around and adjacent to corresponding sides of the body 11, where the four (4) vacuum holes 19$h$ are placed at substantially center point locations for the corresponding sides of the body 11. However, the number and location of the vacuum holes 19*h* may vary with design.

The body 11 may include one or more suitably rigid material(s). For example, the body 11 may include a metallic material, such as stainless steel (SUS).

The support member 13 may be positioned on the disposition hole 15*h*.

A target plate may be placed on the support member 13. In some embodiments, the support member 13 may have a rectangular shape. For example, the support member 13 may have a shape that conforms to that of the disposition hole 15*h*. The support member 13 may be disposed to have an inclination with respect to the body 11. For example, each side of the support member 13 may have an acute angle relative to the first direction D1. (See also, angle 'a' of FIG. 15).

The support member 13 may have a top surface that is below that of the top surface of the body 11. In some embodiments, the support member 13 may be vertically movable up and/or down (hereafter, "up/down movable") (e.g., in the third direction D3). That is, the support member 13 may up/down movable within the disposition hole 15*h* in response to power provided by the drive unit A. Alternatively, the support member 13 may up/down moveable in response to power provided by a separate actuator (not shown).

In some embodiments, the support member 13 may provide an opening (not shown) exposed on the top surface thereof. A fluid may be introduced and/or discharged through the opening provided on the top surface of the support member 13. For example, residual solvent remaining on a flexible plate may be discharged from the opening. (See also, element 2 of FIG. 8D).

The roller unit 3 may be installed on the lower body 7, and may be operationally associated with the lower body 7. The roller unit 3 may be laterally movable (e.g., in the first direction D1) along the guide rail 5. The roller unit 3 may include a lower roller 31, an upper roller 33, a connection member 35, a guide member 37, and a camera part 39.

The lower roller 31 may have a cylindrical shape that extends (e.g.,) in the second direction D2 and rotates about an axis parallel to the second direction D2. For example, the lower roller 31 may be rotationally associated with the connection member 35. The lower roller 31 may be laterally movable (e.g., in the first direction D1) on the base 1. The lower roller 31 may also be up/down moveable (e.g., in the third direction D3).

The lower roller 31 may include a material (e.g., a silicon) providing a first adhesiveness allowing a pellicle to lightly adhere to the lower roller 31. In this regard, the first adhesiveness provided by the lower roller 31 may about 135 gf/25 mm. The lower roller 31 may have a diameter of about 20 mm, but the inventive concept is not limited thereto.

The upper roller 33 may be positioned on (or above) the lower roller 31. The upper roller 33 may be vertically spaced apart from the lower roller 31, by (e.g.,) an extremely small interval. The upper roller 33 may have a cylindrical shape extending (e.g.,) in the second direction D2 and the upper roller 33 may rotate about an axis parallel to the second direction D2.

The upper roller 33 may be rotationally moveable in relation to the connection member 35. Here, the upper roller 33 may rotate in a direction opposite to that of the lower roller 31. The upper roller 33 may be laterally movable on the base 1 (e.g., in the first direction D1), as well as up/down moveable.

The upper roller 33 may include a material (e.g., polyurethane) providing a second adhesiveness, such that a pellicle may adhere to the upper roller 33. Here, the second adhesiveness may be greater than the first adhesiveness. For example, the second adhesiveness provided by the upper roller 33 may be about 160 gf/25 mm. In some embodiments, the upper roller 33 may have a second diameter that is greater than or equal a first diameter of the lower roller 31. For example, the upper roller 33 may have a diameter of about 30 mm.

An upper member 34 extending (e.g.,) in the second direction D2 may be positioned above the upper roller 33 and coupled to the connection member 35, such that the upper member 34 may appropriately position the camera part 39. Thus, the upper member 34 may be laterally moveable (e.g., in the first direction D1) together with the lower roller 31 and the upper roller 33, as well as up/down moveable.

The connection member 35 may be mechanically associated with the lower roller 31 and the upper roller 33, and may be coupled to the guide member 37. That is, the connection member 35 may connect the lower and upper rollers 31 and 33 to the guide member 37 allowing the connection member 35 to be up/down moveable.

In some embodiments, the connection member 35 may include a vertical guide rail 351 inserted into a vertical guide hole 373*h* of the guide member 37, such that the vertical guide rail 351 is up/down moveable along the vertical guide hole 373*h*, thereby allowing the connection member 35 to be up/down moveable. In some example embodiment, two (2) connection members 35 may be provided and spaced apart (e.g.,) in the second direction D2. For example, each of the two (2) connection members 35 may be coupled to opposite ends of the lower roller 31 and of the upper roller 33.

The guide member 37 may be coupled to the connection member 35 and coupled to the guide rail 5, such that the guide member 37 is laterally movable (e.g., in the first direction D1) along the guide rail 5. The guide member 37 may provide a vertical guide hole 373*h* and a horizontal guide hole 37*h*. The vertical guide rail 351 may be inserted into the vertical guide hole 373*h*. The vertical guide rail 351 may move in the vertical guide hole 373*h*. The guide rail 5 may be inserted into the horizontal guide hole 37*h*, such that the guide member 37 may laterally move (e.g., in the first direction D1) along the guide rail 5 inserted into the horizontal guide hole 37*h*. The movement of the guide member 37 allows the lower and upper rollers 31 and 33 to laterally move (e.g., in the first direction D1).

The camera part 39 may be mounted on the upper member 34. Thus, the camera part 39 may include a fixing member 395, a first extension member 391*a*, a front camera 391, a second extension member 393*a*, and a rear camera 393. The fixing member 395 may fix the camera part 39 to the upper member 34. The first extension member 391*a* may extend (e.g.,) in the first direction D1 from the fixing member 395. The first extension member 391*a* may connect the fixing member 395 and the front camera 391 to each other. The front camera 391 may be associated with the first extension member 391*a*. The front camera 391 may be configured such that one or both of the lower and upper rollers 31 and 33 are captured (e.g.,) in the first direction D1. The second extension member 393*a* may extend, from the fixing member 395, in an opposite lateral direction. The second extension member 393*a* may connect the fixing member 395 and the rear camera 393 to each other. The rear camera 393 may be associated with the second extension member 393*a*. The rear camera 393 may be configured such that one or both of the lower and upper rollers 31 and 33 are captured in (e.g.,) the opposite direction.

The guide rail 5 may be laterally spaced apart from the base 1. Here, the guide rail 5 may be positioned on the lower body 7, however the inventive concept is not limited thereto, and the guide rail 5 may be laterally spaced apart from the lower body 7. The guide rail 5 may laterally extend (e.g.,) in the first direction D1. The guide rail 5 may be inserted into the horizontal guide hole 37h of the guide member 37. The guide member 37 may move (e.g.,) in the first direction D1 along the guide rail 5. In some embodiments, two (2) guide rails 5 may be provided, where the guide rails 5 may be spaced apart in (e.g.,) the second direction D2. However, the number and position of the guide rails 5 may vary by design.

The lower body 7 may support one or both of the base 1 and the roller unit 3. The lower body 7 may be positioned below the base 1. In some embodiments, the lower body 7 may include a drive mechanism capable of driving the support member 13 of the base 1 up and/or down.

The drive unit A may be coupled to the guide member 37 and may be configured to drive the roller unit 3. That is, the drive unit A may drive the guide member 37 (e.g.,) in the first direction D1. In addition, the drive unit A may be configured to rotate one or both of the lower and upper rollers 31 and 33. The drive unit A may include various elements (e.g., one or more servo motors) capable of laterally moving the roller unit 3. However, the inventive concept is not limited thereto, and the drive unit A may include a mechanism capable of laterally moving the roller unit 3 and/or rotating the lower roller 31.

The vertical drive unit Y may be connected to the upper member 34, and may be configured to vertically move the lower roller 31 and the upper roller 33. The vertical drive unit Y may include various elements (e.g., a hydraulic cylinder) providing the up/down movement of the lower and upper rollers 31 and 33.

The vacuum pump V may be connected to the vacuum hole 19h in order to apply a vacuum pressure through the vacuum hole 19h (or a plurality of vacuum holes 19h).

Figure 2:
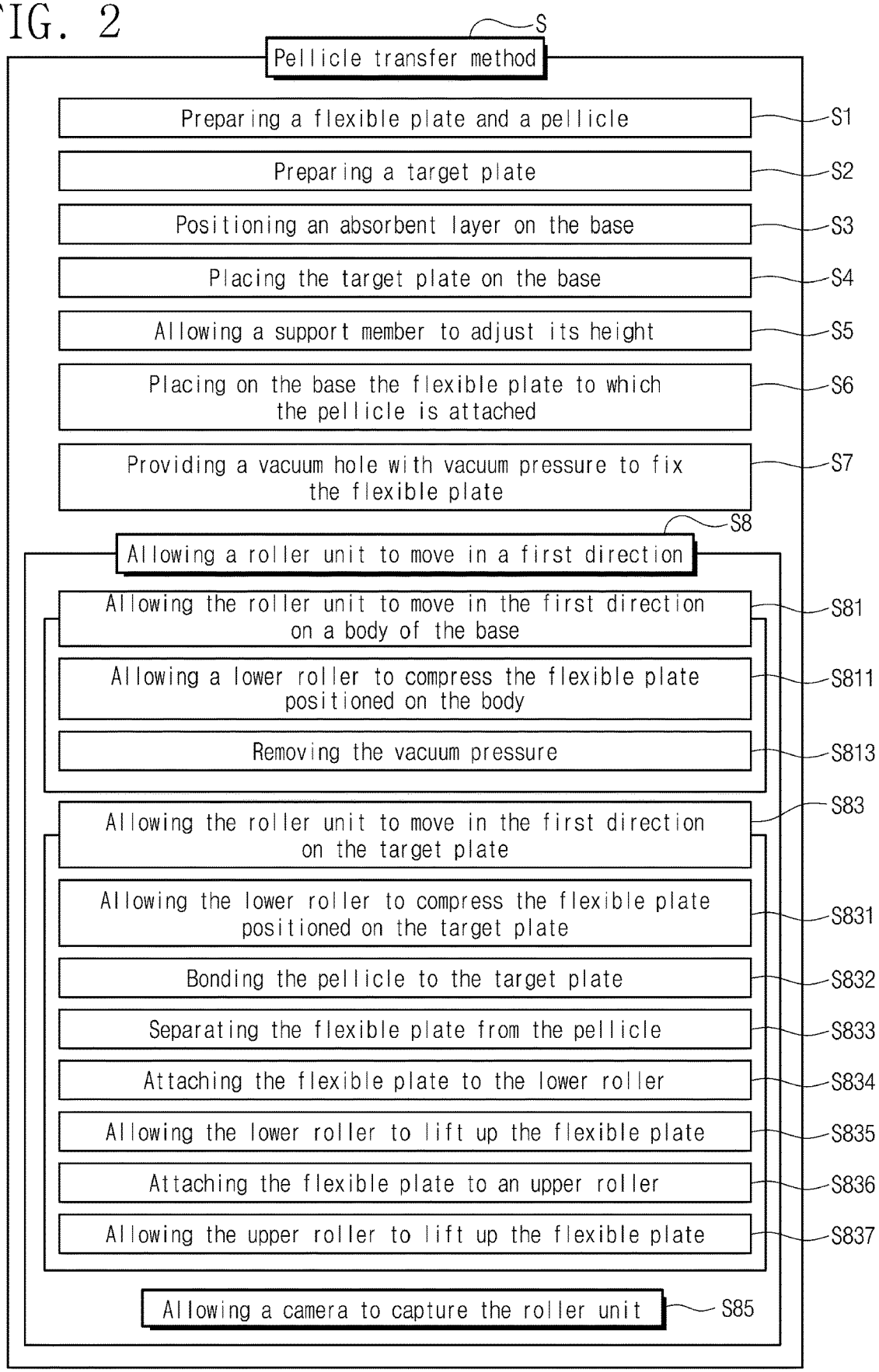
FIG. 2 is a flow chart summarizing a pellicle transfer method according to embodiments of the inventive concept.

FIG. 2 illustrates a flow chart summarizing a method of transferring a pellicle transfer according to embodiments of the inventive concept.

Referring to FIG. 2, a pellicle transfer method S may include a step S1 of preparing a flexible plate and a pellicle, a step S2 of preparing a target plate, a step S3 of positioning an absorbent layer on a base, a step S4 of placing the target plate on the base, a step S5 of allowing a support member to adjust its height, a step S6 of placing on the base the flexible plate to which the pellicle is attached, a step S7 of providing a vacuum hole with vacuum pressure to fix the flexible plate, and a step S8 of allowing a roller unit to move in a first direction.

Step S8 may include a step S81 of allowing the roller unit to move in a first direction on a body of the base, a step S83 of allowing the roller unit to move in the first direction on the target plate, and a step S85 of allowing a camera to capture the roller unit.

Step S81 may further include a step S811 of allowing a lower roller to compress the flexible plate positioned on the body and a step S813 of removing the vacuum pressure.

Step S83 may further include a step S831 of allowing the lower roller to compress the flexible plate positioned on the target plate, a step S832 of bonding the pellicle to the target plate, a step of S833 of separating the flexible plate from the pellicle, a step S834 of attaching the flexible plate to the lower roller, a step S835 of allowing the lower roller to lift up the flexible plate, a step S836 of attaching the flexible plate to an upper roller, and a step S837 of allowing the upper roller to lift up the flexible plate.

The written description of subsequent drawings will expand upon the summary of method steps presented in the flowchart of FIG. 2.

Figure 3:
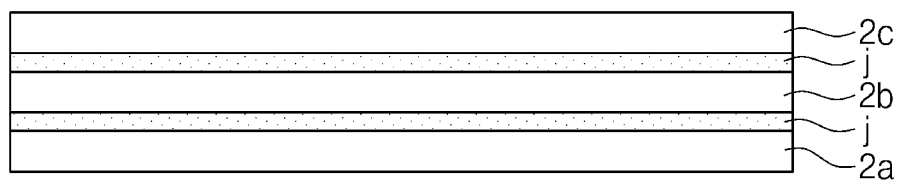
FIGS. 3 and 4 are respective cross-sectional views illustrating a flexible plate for pellicle transfer according to embodiments of the inventive concept.
Figure 4:
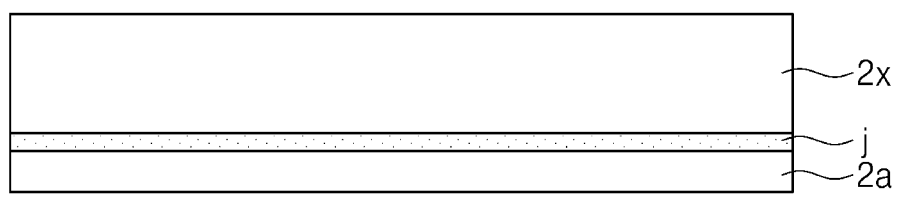

FIGS. 3 and 4 are respective cross-sectional views illustrating in various examples a flexible plate that may be used for pellicle transfer according to embodiments of the inventive concept.

Referring to FIGS. 2 and 3, step S1 may include preparing a flexible plate 2' that may include a plurality of stacked films. For example, the flexible plate 2' may include three (3) films that are stacked on each other. That is, a first film 2a, a second film 2b, and a third film 2c may be sequentially stacked. A bonding layer 'j' may be placed between the first film 2a and the second film 2b and/or between the second film 2b and the third film 2c. The bonding layer j may be used to bond the first film 2a and the second film 2b to each other and/or the second film 2b and the third film 2c to each other. The bonding layer j may include at least one of an adhesive tape, a glue, an epoxy resin, a photo-softening tape, a thermal release tape, a water-soluble tape, etc. For example, the bonding layer j may include at least one of polybenzimidazole (PBI), polyimide (PI), silicon/imide, bismaleimide (BMI) and modified epoxy resin. One or more of the first, second, and third films 2a, 2b, and 2c may include at least one of polyethylene terephthalate (PET), polyimide, glass, polyethylene naphthalate (PEN), polycarbonate (PC), polycarbonate track etched (PTCE), silicon (Si), urethane, plastic, and rubber. For example, one or more of the first, second, and third films 2a, 2b, and 2c may include a PET OHP film. In some embodiments, one or more of the first, second, and third films 2a, 2b, and 2c may have a thickness of about 75 μm.

Referring to FIG. 4, a flexible plate 2" may include a first film 2a, a bonding layer j, and a fourth film 2x. The first film 2a may include a PET OHP film. The fourth film 2x may include PCTE. The first film 2a may have a thickness of about 75 μm. The fourth film 2x may have a thickness of about 250 μm.

Possible configurations of a flexible plate are limited to that shown in FIGS. 3 and 4. For example, a flexible plate may include either a single film, two (2) films, or four (4) or more films. When a flexible plate is relatively thick, it may be easier to control the rigidity of the flexible plate following transfer of the pellicle.

Figure 5:
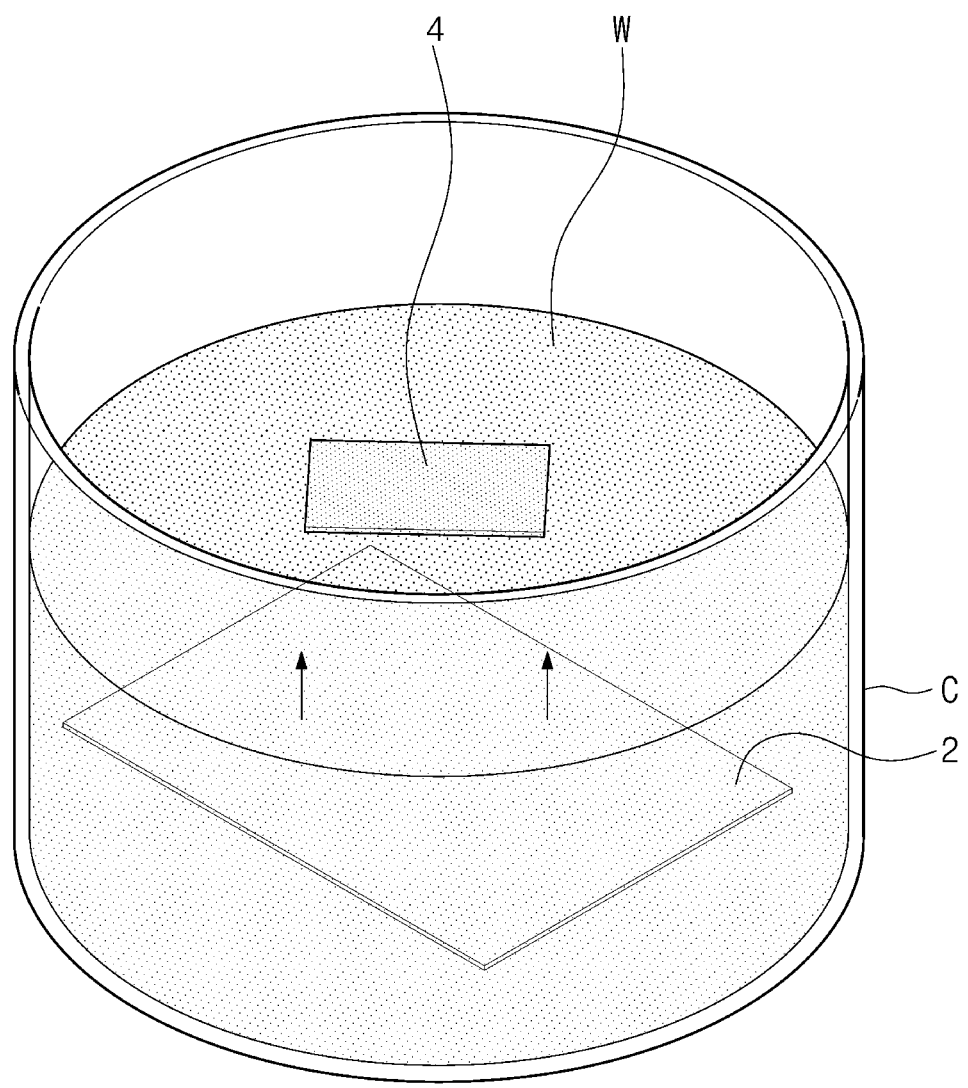
FIG. 5 is a perspective view illustrating the attachment of a pellicle to a flexible plate during a pellicle transfer according to embodiments of the inventive concept.

FIG. 5 is a perspective view further illustrating the attachment of a pellicle to a flexible plate during the transfer of a pellicle according to embodiments of the inventive concept.

Referring to FIGS. 2 and 5, step S1 includes attaching a pellicle 4 to a flexible plate 2, where the pellicle 4 may be formed in various ways. For example, the pellicle 4 may be formed by chemical vapor deposition (CVD). That is, the pellicle 4 may be formed by CVD on a surface of either a thin catalytic metal layer or a wafer. When the pellicle 4 is formed, the catalytic metal may be removed from the pellicle 4. The pellicle 4 may be variously shaped. For example, the pellicle 4 may have a rectangular shape, a square shape, an octagonal shape, etc. However, for convenience of description, the pellicle 4 is assumed to have a rectangular shape.

In some embodiments, the pellicle 4 may be attached to the flexible plate 2 by floating the flexible plate 2 upward in a container C of solvent W until it contacts the pellicle 4, which is floating on the surface of the solvent W. In this manner, the pellicle 4 may be attached using the solvent W to the flexible plate 2. Here, the solvent W may include water and/or alcohol, but the inventive concept are not limited thereto.

Figure 6:
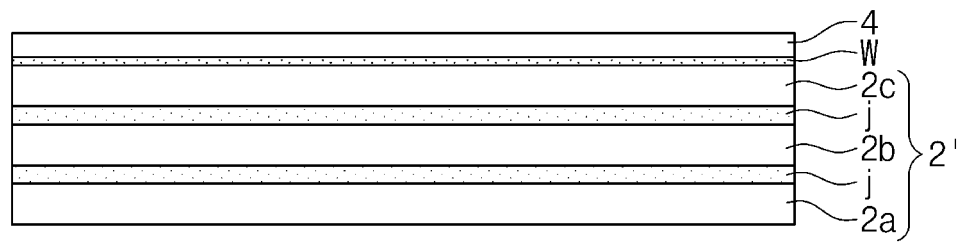
FIG. 6 is a cross-sectional view illustrating a pellicle attached to a flexible plate by a pellicle transfer according to embodiments of the inventive concept.

FIG. 6 is a cross-sectional view illustrating the pellicle 4 of FIG. 5 after attachment to the flexible plate 2' of FIG. 3 using a pellicle transfer method according to embodiments of the inventive concept.

Referring to FIGS. 3, 5 and 6, the pellicle 4 may be attached to the flexible plate 2' using the solvent W. Here, the pellicle 4 may have a thickness of about 50 nm or less.

Figure 8A:
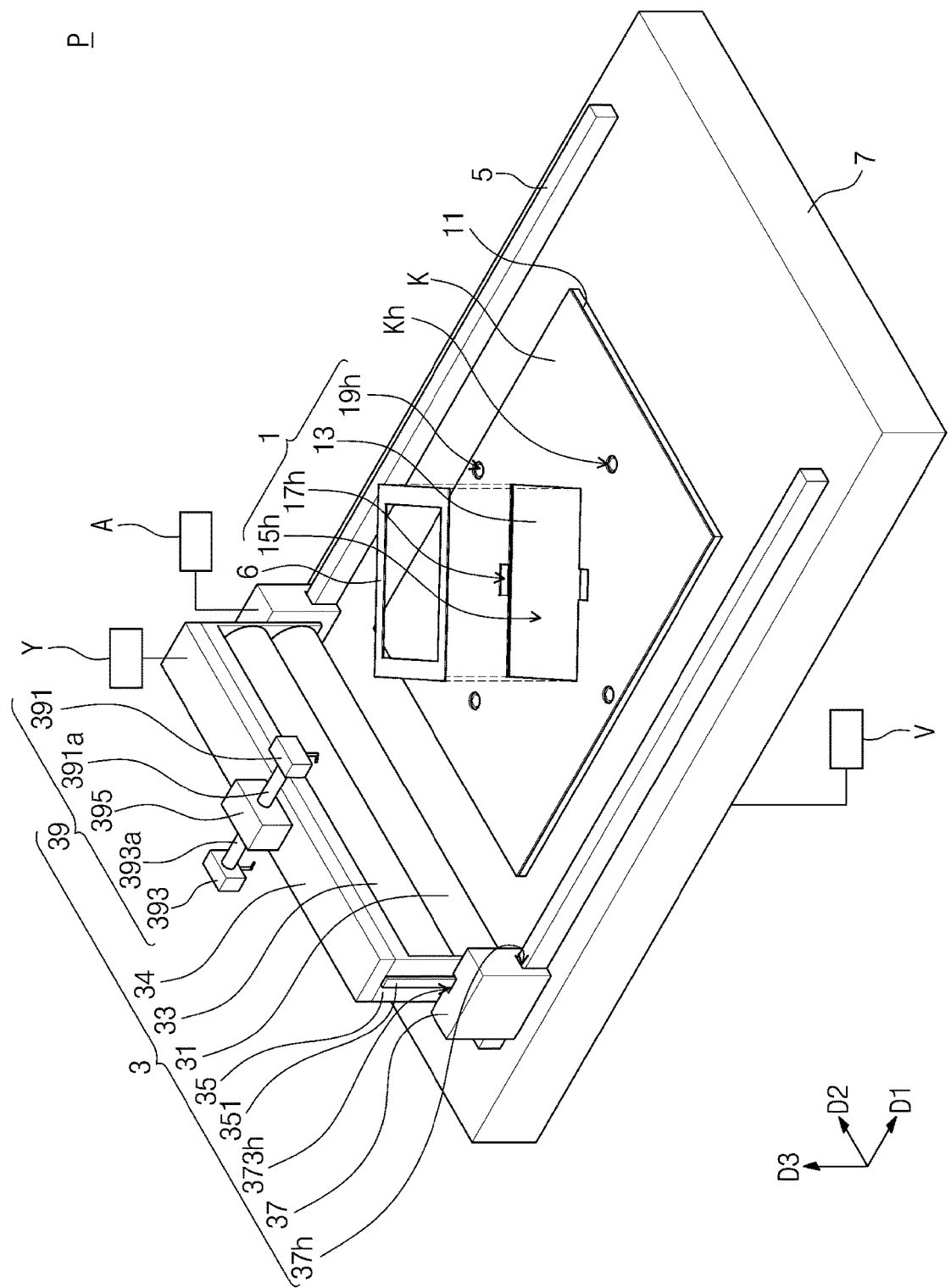
FIG. 8A is a perspective view illustrating the placement of a target plate on a pellicle transfer apparatus according to embodiments of the inventive concept.

Referring to FIGS. 2 and 8A, step S2 may include preparing a target plate 6 having a shape that conforms to that of the support member 13. Hence, the target plate 6 may be an open frame having a hollowed-out center portion. An adhesive material (e.g., an adhesive agent and/or an adhesive tape) may be coated on the target plate 6.

Figure 7:
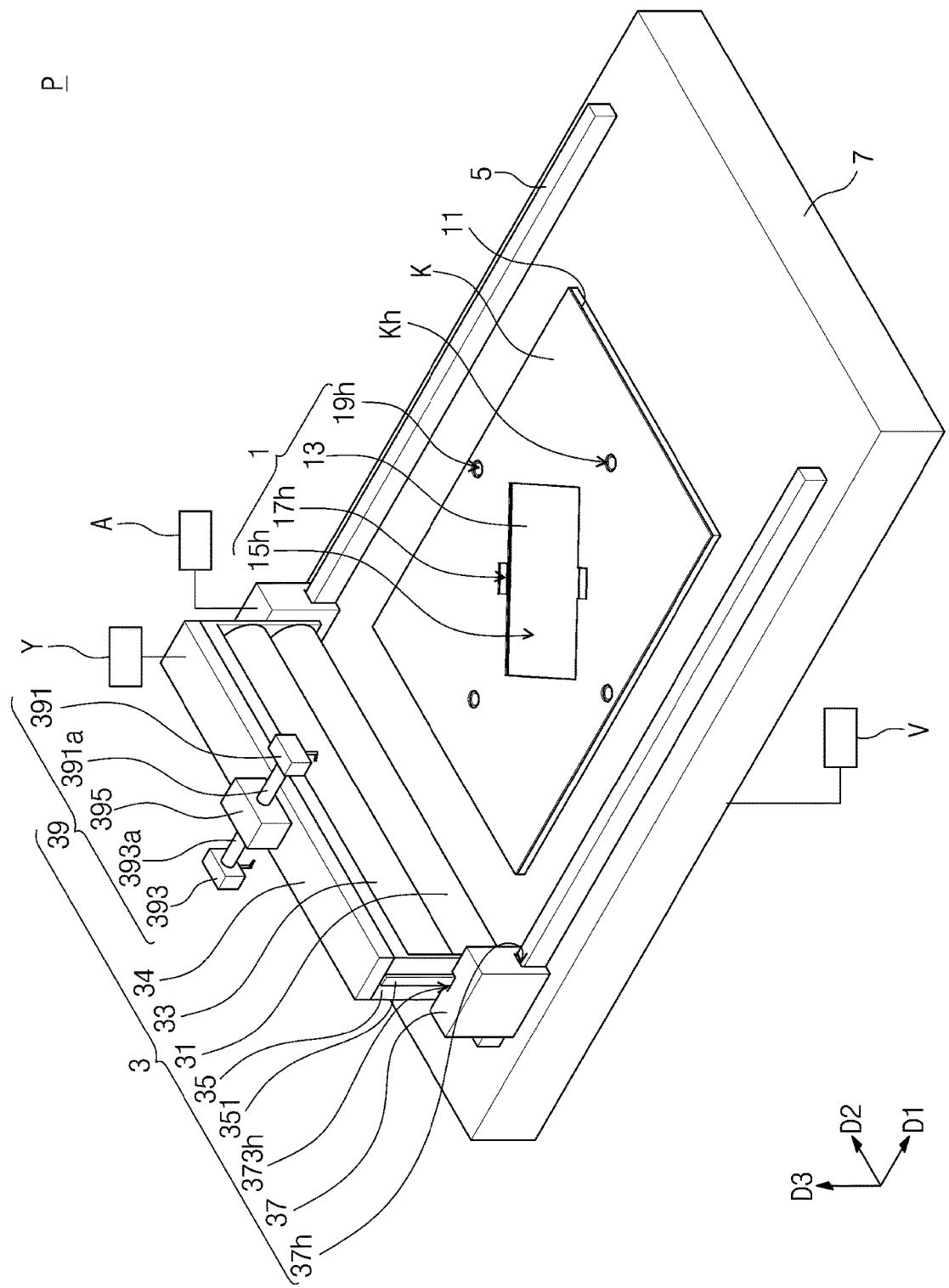
FIG. 7 is a perspective view illustrating a pellicle transfer apparatus on which an absorbent layer is coated according to embodiments of the inventive concept.

FIG. 7 is a perspective view illustrating a pellicle transfer apparatus on which an absorbent layer is coated according to embodiments of the inventive concept.

Referring to FIGS. 2 and 7, step S3 may include coating the base 1 with an absorbent material to form an absorbent layer 'K'. That is, the absorbent layer K may include one or more material(s) that absorbs any residual solvent. (See also, element W of FIGS. 5 and 6). In some embodiments, the absorbent layer K may cover the body 11 of the base 1. However, the absorbent layer K should not cover the disposition hole 15h, but leave it exposed. The absorbent layer K may also include an exposure hole Kh, corresponding in location to that of the vacuum hole 19h (or plurality of vacuum holes 19h) in order to expose the vacuum hole 19h.

FIG. 8A is a perspective view illustrating placement of a target plate by a pellicle transfer apparatus according to embodiments of the inventive concept.

Referring to FIGS. 2 and 8A, step S4 may include placing the target plate 6 on the base 1, where the target plate 6 may be disposed in the disposition hole 15h and placed on the support member 13.

Figure 8B:
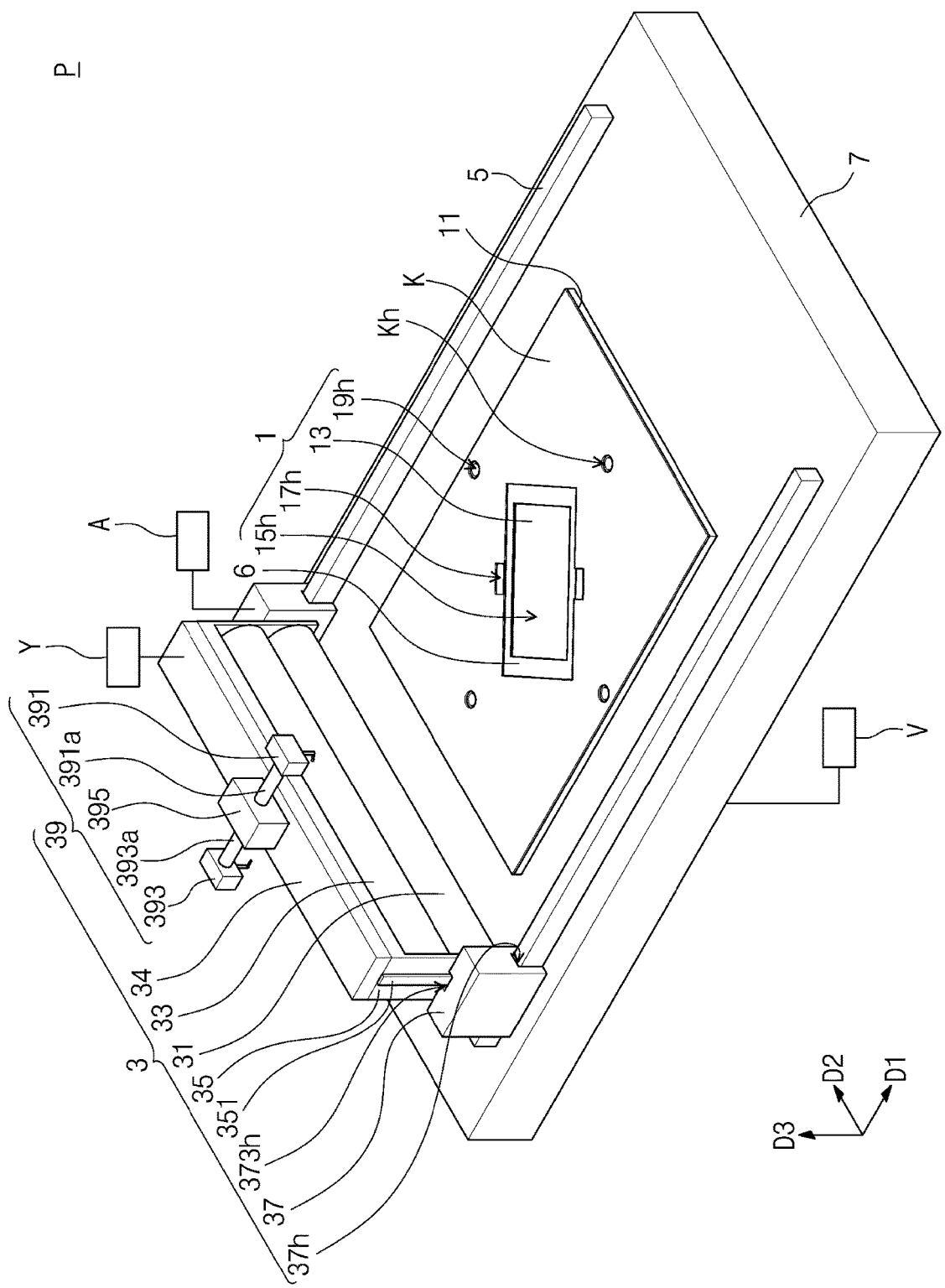
FIG. 8B is a perspective view illustrating a pellicle transfer apparatus on which a target plate is placed according to embodiments of the inventive concept.
Figure 8C:
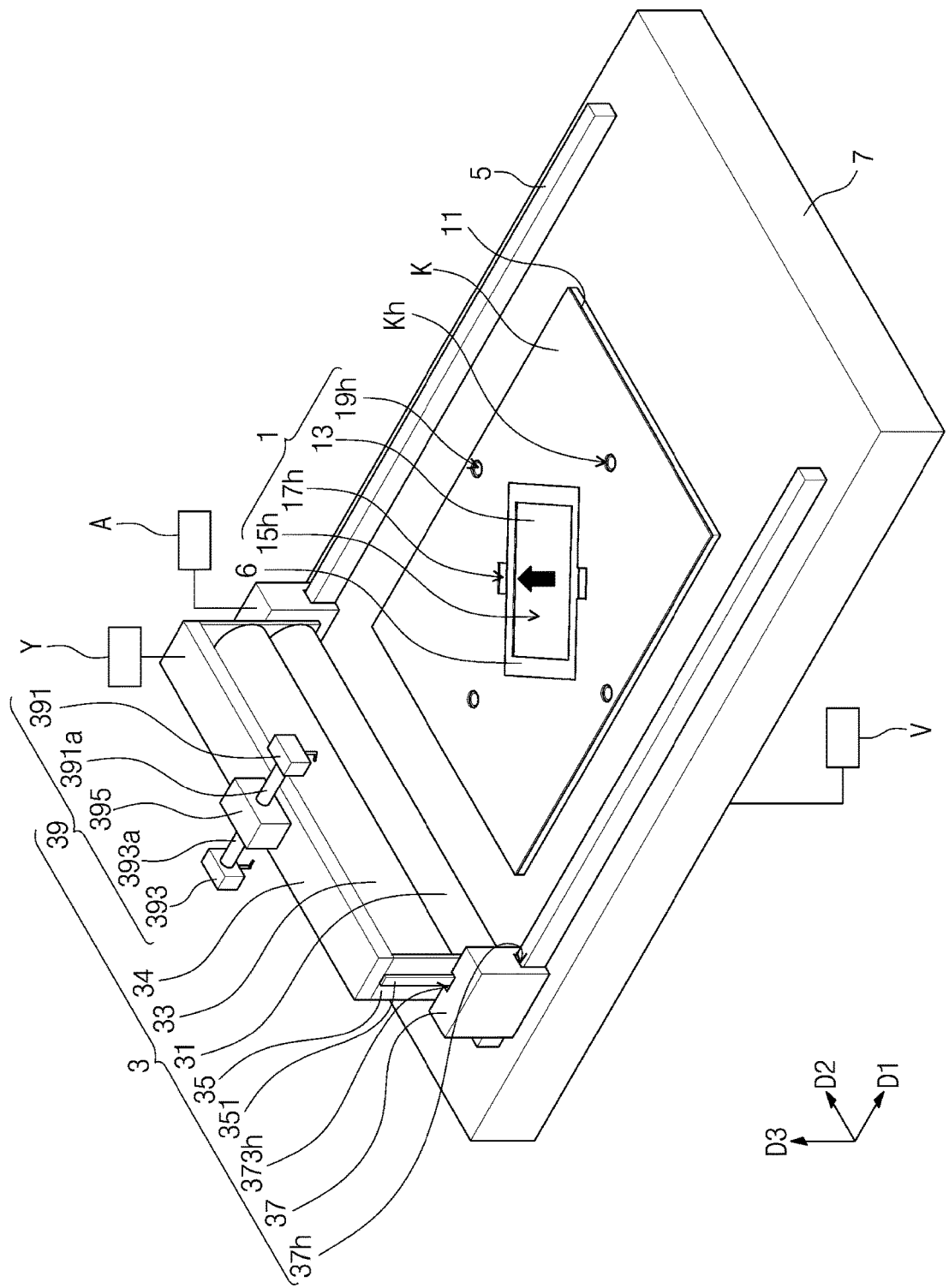
FIG. 8C is a perspective view illustrating a height adjustment for a support member in a pellicle transfer apparatus according to embodiments of the inventive concept.

FIG. 8B is a perspective view illustrating a pellicle transfer apparatus on which a target plate has been placed according to embodiments of the inventive concept, and FIG. 8C is a perspective view illustrating a height adjustment made to a support member in a pellicle transfer apparatus according to embodiments of the inventive concept.

Referring to FIGS. 2, 8B and 8C, following step S4, step S5 may include adjusting (i.e., vertically raising and/or lowering) the height of the support member 13. A separate mechanism (not shown) may be sed to adjust the height of the support member 13. Adjustment in the height of the support member 13 may correspondingly change the height of the target plate 6. The height of the support member 13 may be adjusted until a top surface of the target plate 6 reaches a height at which the pellicle transfer process may be appropriately performed. For example, the top surface of the target plate 6 may be positioned at substantially the same height as the top surface of the body 11. Alternately, the top surface of the target plate 6 may be positioned at substantially the same height as a top surface of the absorbent layer K. Alternately, the top surface of the target plate 6 may be positioned at a height slightly lower than the top surface of the absorbent layer K.

In some embodiments, the height of the target plate 6 may be adjusted to allow the absorbent layer K to have its top surface at substantially the same height as a top surface of a pellicle which is provided on the top surface of the target plate 6. (See also, element of FIG. 8D). However, the inventive concept is not limited thereto and the top surface of the target plate 6 may be variously adjusted in height based on (1) the presence or absence of the absorbent layer K; (2) the thickness of the pellicle 4; and/or the particular material(s) and thickness of the flexible plate. (See also, element 2 of FIG. 8D). In this manner the transfer of the pellicle 4 onto the target plate 6 may be facilitated.

Figure 8D:
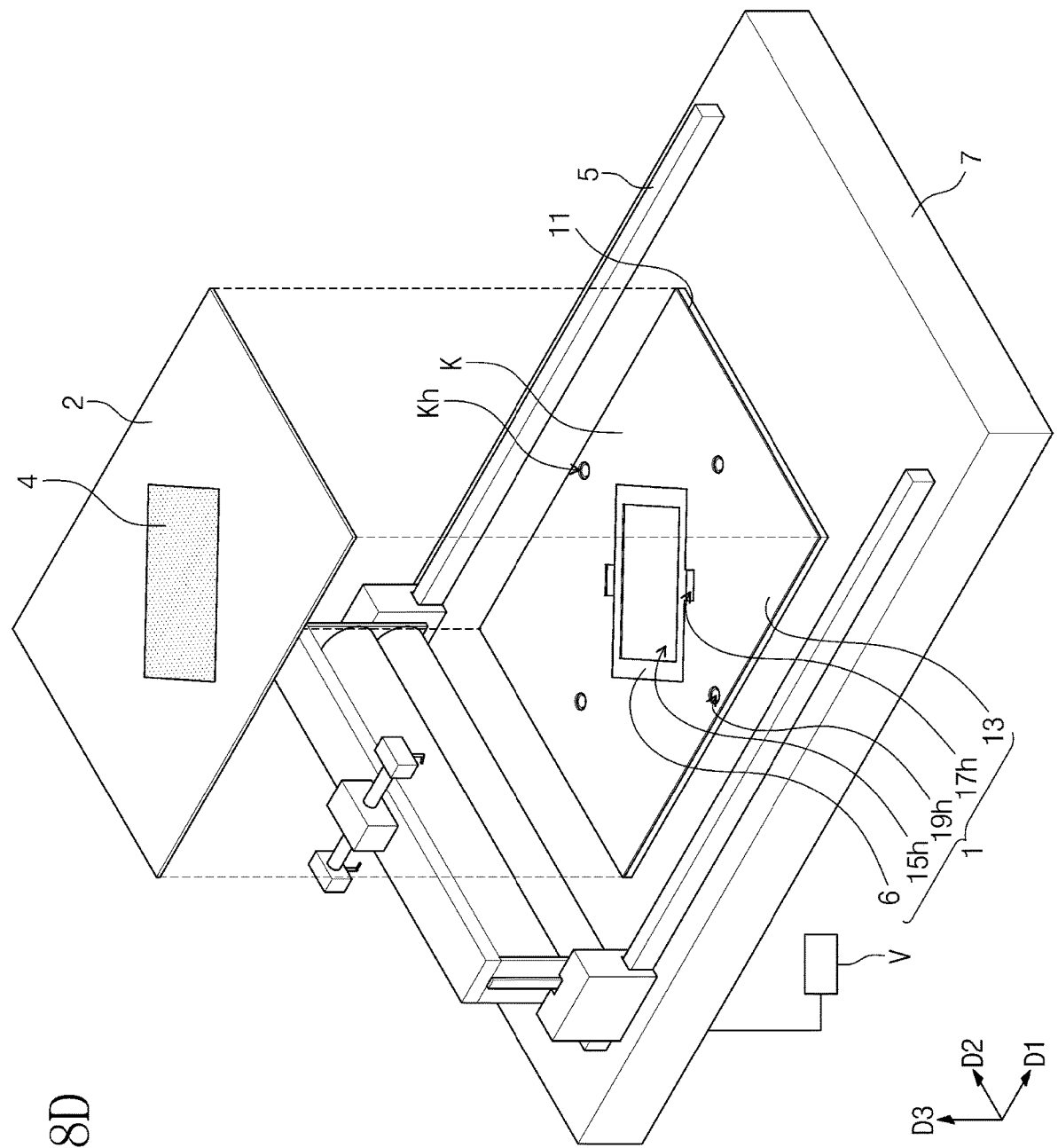
FIG. 8D is a perspective view illustrating the placement of a pellicle and a flexible plate on a pellicle transfer apparatus according to embodiments of the inventive concept.
Figure 9:
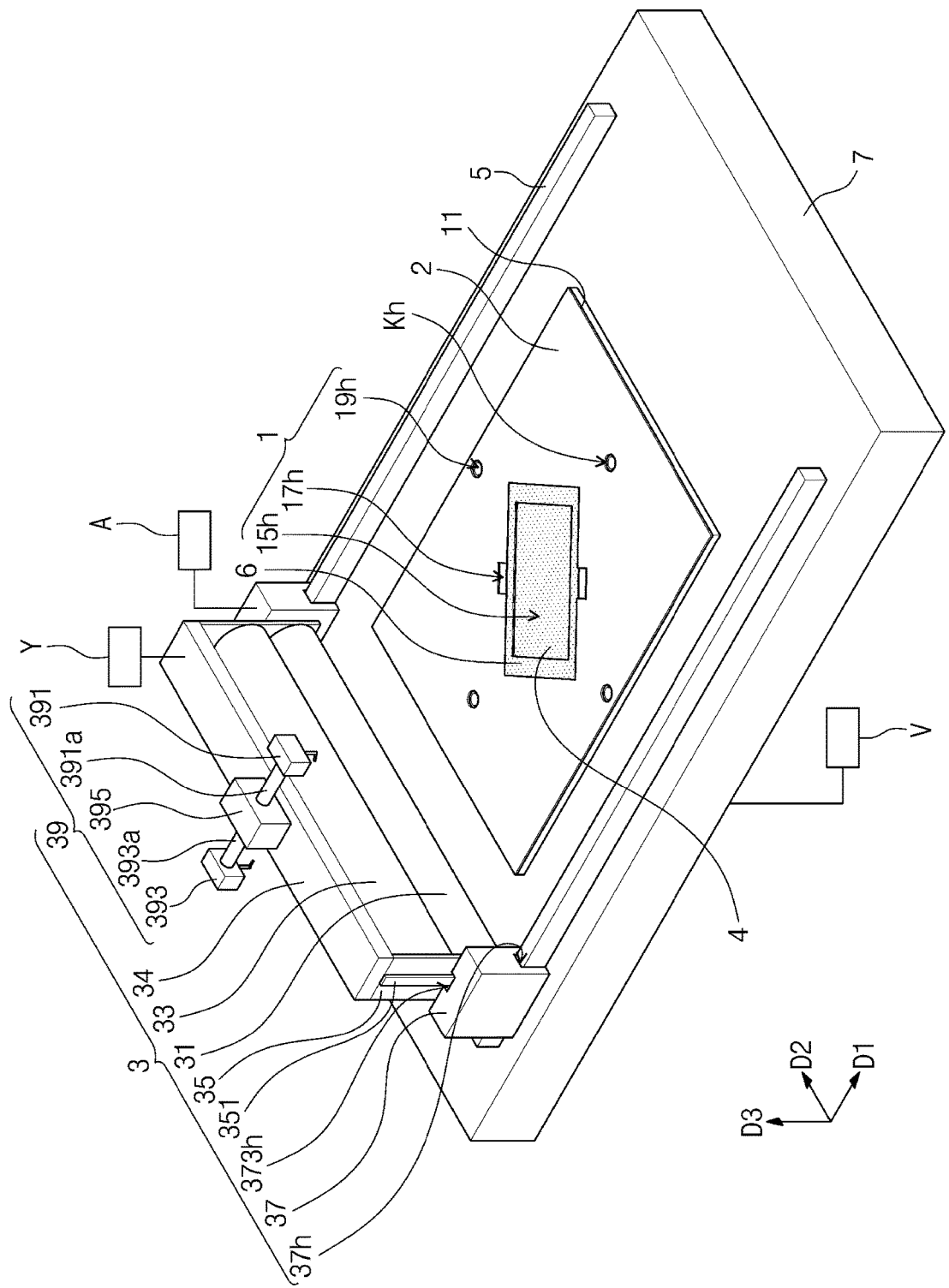
FIG. 9 is a perspective view illustrating a pellicle transfer apparatus on which a pellicle and a flexible plate are placed according to embodiments of the inventive concept.

FIG. 8D is a perspective view illustrating the placement of a pellicle onto a flexible plate by a pellicle transfer apparatus according to embodiments of the inventive concept, and FIG. 9 is a perspective view illustrating a pellicle transfer apparatus on which a pellicle and a flexible plate have been placed according to embodiments of the inventive concept.

Referring to FIGS. 2, 8D and 9, step S6 may include placing the combination of the flexible plate 2 and the pellicle 4 on the base 1 on which the absorbent layer K and the target plate 6 have already been placed. Here, the pellicle 4 may be attached to a bottom surface of the flexible plate 2, and the flexible plate 2 may be lowered onto the base 1, such that the pellicle 4 is properly positioned between the base 1 and the flexible plate 2. As noted above, the pellicle 4 may have a shape and a size substantially the same as the target plate 6. Alternately, the size of the pellicle 4 may be slightly greater than that of the target plate 6. The flexible plate 2 may have a shape and size substantially the same as the top surface of the base 1.

Referring to FIGS. 2 and 9, step S7 may include allowing the vacuum pump V to apply vacuum pressure to the vacuum hole 19h. When the vacuum pressure is applied to the vacuum hole 19h, the vacuum pressure fixes the flexible plate 2 that is placed on the vacuum hole 19h. Assuming the used of four (4) vacuum holes 19h, the vacuum pressure may be applied at four (4) locations around the bottom surface of the flexible plate 2, thereby fixing the flexible plate 2 to provide a stable platform for transfer of the pellicle 4.

At this point, the target plate 6, the pellicle 4, and the flexible plate 2 are vertically stacked on the base 1. And the absorbent layer K may (optionally) be stacked on the top surface of the body 11. The target plate 6 may be stacked on the support member 13. The pellicle 4 may be stacked on the target plate 6. The flexible plate 2 may be stacked on the pellicle 4, the absorbent layer K, and/or the body 11.

As the absorbent layer K is positioned on the body 11, the absorbent layer K may absorb any residual solvent remaining on the flexible plate 2. Therefore, the flexible plate 2 may be prevented from sliding due to the presence of residual solvent W. This prevents possible damage to and/or warping in the flexible plate 2.

Figure 10:
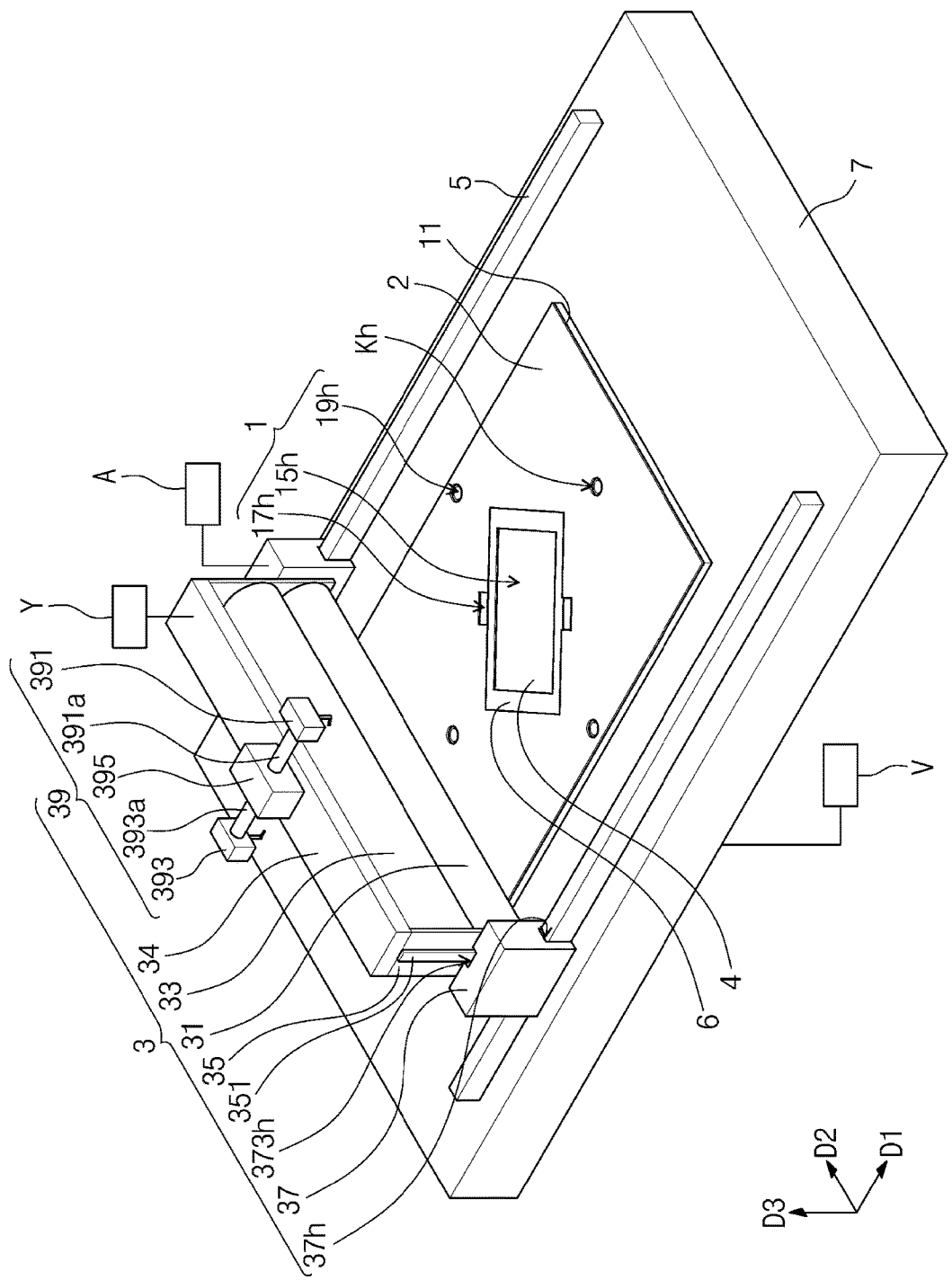
FIG. 10 is a perspective view illustrating movement of a roller unit in a pellicle transfer apparatus according to embodiments of the inventive concept.

FIG. 10 is a perspective view illustrating lateral movement of a roller unit in a pellicle transfer apparatus according to embodiments of the inventive concept.

Referring to FIGS. 2 and 10, step S8 may include allowing the drive unit A to drive the roller unit 3 to laterally move (e.g., in the first direction D1). One possible approach to step S8 will be described with reference to FIGS. 11A, 11B, 12, 13 and 14.

Figure 11A:
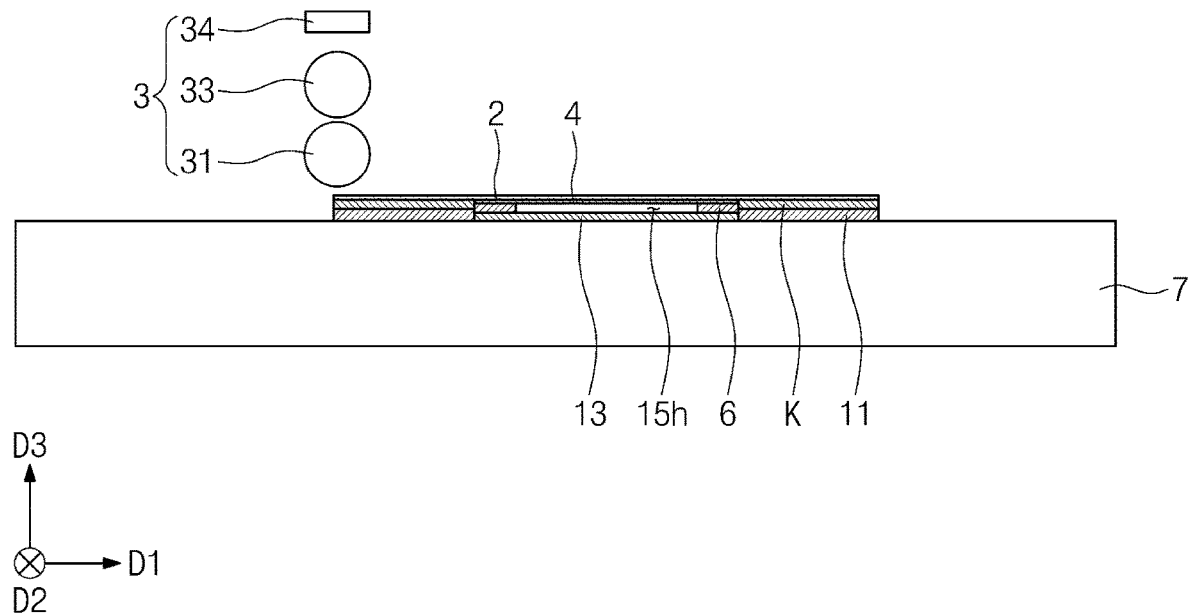
FIGS. 11A, 11B, 12, 13 and 14 are related cross-sectional views further illustrating a pellicle transfer method according to embodiments of the inventive concept.

Referring to FIGS. 2 and 11A, step S81 may include allowing the lower and upper rollers 31 and 33 to move laterally in the first direction D1 across the body 11. In some embodiments, the lower roller 31 and the upper roller 33 may be vertically spaced apart, wherein the lower roller 31 and the upper roller 33 are separated by an extremely small interval into which the flexible plate 2 may be introduced. However, the interval between the lower and upper rollers 31 and 33 may be adjusted according to design.

Figure 11B:
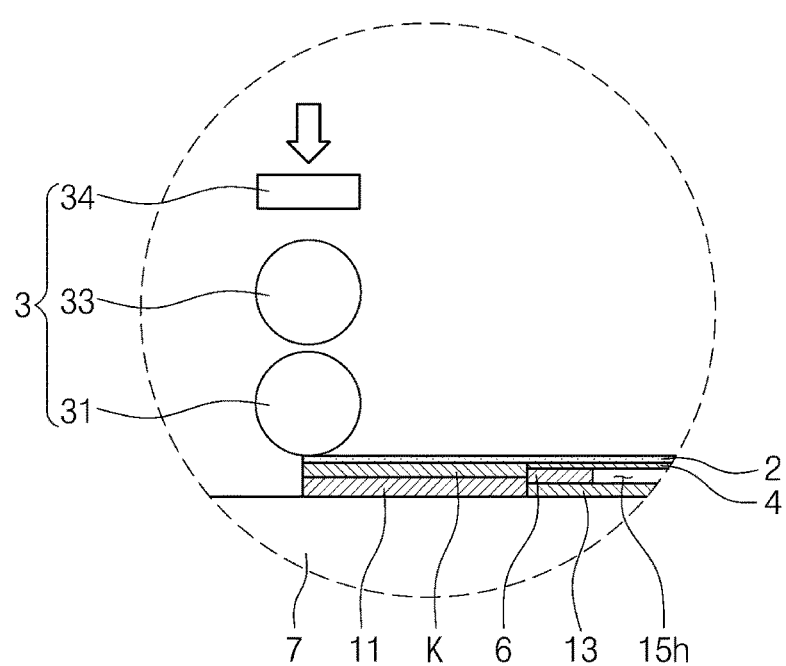

Referring to FIGS. 2 and 11B, step S811 may include adjusting a height for the roller unit 3. For example, the vertical drive unit Y may drive the roller unit 3 to descend until a bottom end of the lower roller 31 reaches substantially the same height as a top surface of the flexible plate 2, such that a bottom end of the roller unit 3 compresses the top surface of the flexible plate 2. The flexible plate 2 may be attached to the lower roller 31. For example, the adhesive force of the lower roller 31 may attach the flexible plate 2 to the lower roller 31. In some embodiments, the height of the roller unit 3 may be adjusted before step S8 begins.

Figure 12:
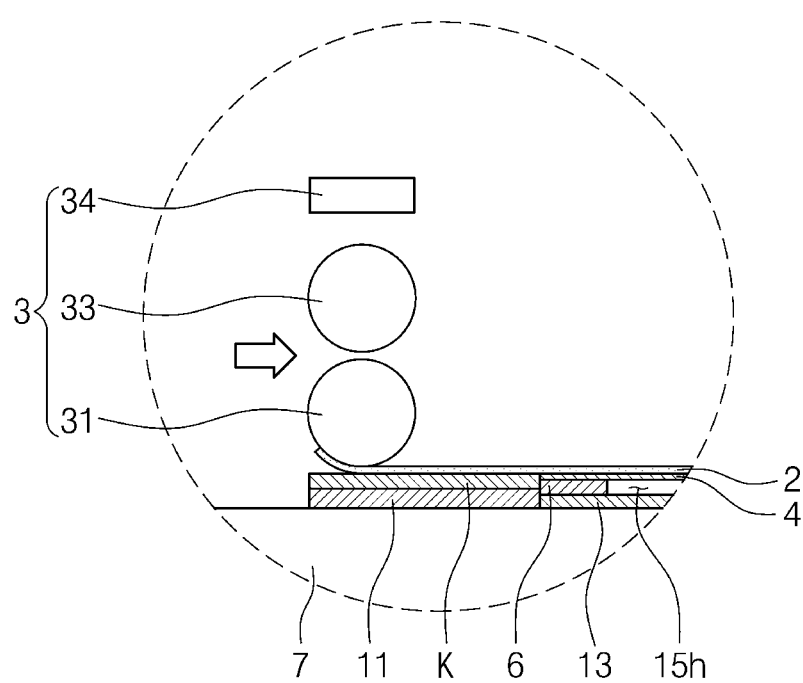

Referring to FIG. 12, as the roller unit 3 laterally moves in the first direction D1, the lower roller 31 may lift up the flexible plate 2. For example, when the lower roller 31 rotates while moving in the first direction D1, the adhesive force of the lower roller 31 allow the flexible plate 2 to lift and wrap around the lower roller 31. As shown in FIG. 12, as the lower roller 31 rotates in a clockwise direction, the flexible plate 2 may move upwards to wrap around a left side of the lower roller 31.

Referring to FIG. 2, step S813 may include removing the vacuum pressure applied to the vacuum hole 19h. Assuming the use of a plurality of vacuum holes 19H, as soon as the lower roller 31 passes over a vacuum hole in the plurality of the vacuum holes 19h, the vacuum pressure may be sequentially removed from the various vacuum holes allowing the flexible plate 2 to be readily moved upwards, wrapping around the lower roller 31. Alternately, as soon as the lower roller 31 passes over a first vacuum hole in the plurality of the vacuum holes 19h, the vacuum pressure may be removed from all of the plurality of vacuum holes 19h.

Here, selective application of vacuum pressure should be designed to fix the flexible plate 2 to the body 11 while the lower roller 31 applies force to one side of the flexible plate 2, such that damage and/or warpage of the flexible plate 2 and/or the pellicle may be prevented.

Figure 13:
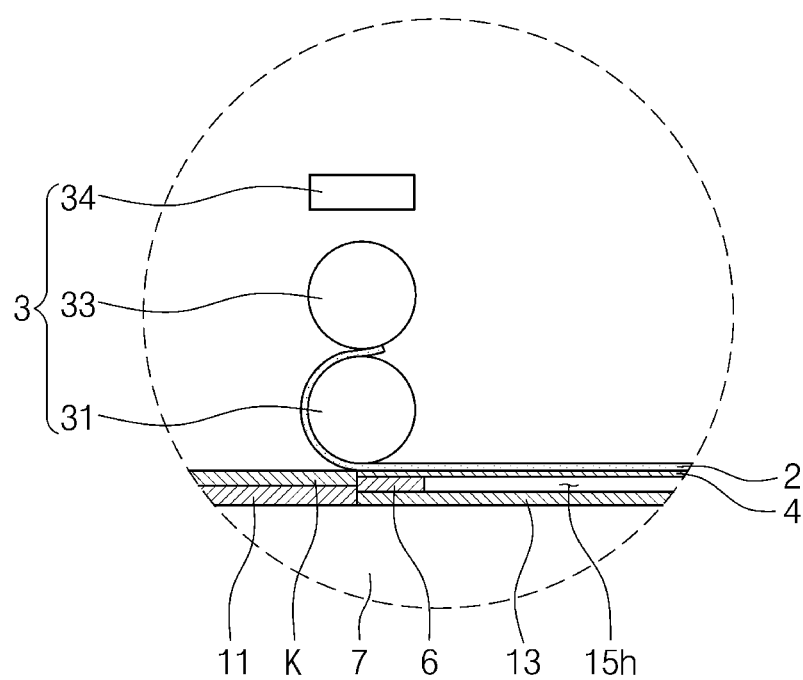

Referring to FIGS. 2 and 13, step S83 may include allowing the roller unit 3 to approach on the target plate 6.

Step S831 may include allowing a bottom end of the lower roller 31 to compress the flexible plate 2 disposed on the target plate 6.

Step S832 may include allowing the flexible plate 2 to compress the pellicle 4 as the lower roller 31 compresses the flexible plate 2. The pellicle 4 may be supplied with a downward force to motivate the pellicle 4 to bond to the target plate 6. For example, when the pellicle 4 undergoes a downward compression from the flexible plate 2, the pellicle 4 may be bonded to the target plate 6 by an adhesive material coating the target plate 6.

Figure 14:
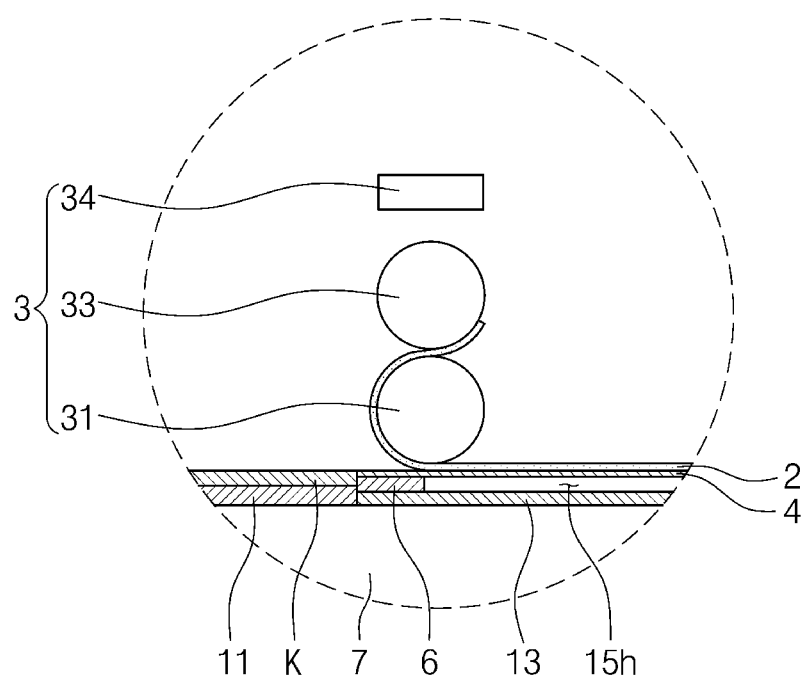

Referring to FIGS. 2 and 14, steps S833, S834, and S835 may be performed substantially at the same time. When an adhesive force of the adhesive material bonds the pellicle 4 to the target plate 6, the adhesive force of the lower roller 31 may adhere the flexible plate 2 to the lower roller 31. When the lower roller 31 rotates while moving in the first direction D1, the flexible plate 2 may lift to wrap around the lower roller 31. Therefore, the flexible plate 2 may be separated from the pellicle 4. An adhesive force between the pellicle 4 and the target plate 6 may be greater than that between the flexible plate 2 and the pellicle 4. In addition, an adhesive force between the flexible plate 2 and the lower roller 31 may be greater than that between the flexible plate 2 and the pellicle 4. The lower roller 31 may continuously rotate while moving in the first direction D1, and thus the flexible plate 2 may become in contact with the upper roller 33.

Step S836 may include allowing the flexible plate 2 to adhere to the upper roller 33 with which the flexible plate 2 is in contact. For example, the adhesive force of the upper roller 33 may adhere the flexible plate 2 to the upper roller 33.

Step S837 may include allowing the flexible plate 2 to separate from the lower roller 31. When the adhesive force of the upper roller 33 is greater than that of the lower roller 31, the flexible plate 2 may be separated from the lower roller 31 and then may lift to wrap around the upper roller 33. As shown in FIG. 14, as the upper roller 33 rotates in a counterclockwise direction, the flexible plate 2 may move upwards to wrap a right side of the upper roller 33.

The pellicle 4 may be attached to the target plate 6 while the lower roller 31 turns to wind up the flexible plate 2. At this time, because the upper roller 33 receives the flexible plate 2 rolled around the lower roller 31, the lower roller 31 may continuously compress the flexible plate 2 against a surface of the lower roller 31. In such cases, the flexible plate 2 may be prevented from wrapping around the lower roller 31 about one or more turns. Therefore, when the lower roller 31 moves in the first direction D1 to compress the flexible plate 2 that wraps the lower roller 31, the compression process may be prevented from being interrupted by the flexible plate 2 that previously wraps the lower roller 31. Accordingly, the compression process may be uniformly performed in which the lower roller 31 compresses the flexible plate 2. In addition, the flexible plate 2 may be prevented from being deformed and/or damaged.

Step S85 may include allowing the front camera 391 to capture action of one or both of the lower and upper rollers 31 and 33 in a forward first direction D1. Step S85 may also include allowing the rear camera 393 to capture action of one or both of the lower and upper rollers 31 and 33 in a reverse first direction D1 opposite the forward first direction D1. The front camera 391 may capture the flexible plate 2 as it wraps around a front side of the lower roller 31 and/or on a front side of the upper roller 33. The rear camera 393 may capture the flexible plate 2 as it wraps around a rear side of one or both of the lower roller 31 and the upper roller 33. If the flexible plate 2 becomes deformed or damaged due to wrinkling, for example, the front camera 391 and/or the rear camera 393 may detect such deformation or damage and halt the wrapping process and/or issue an alarm (e.g., a visual and/or audible alarm). Hence, if deformation or damage to the flexible plate 2 is detected, the pellicle transfer process may be interrupted and/or corrected.

Figure 15:
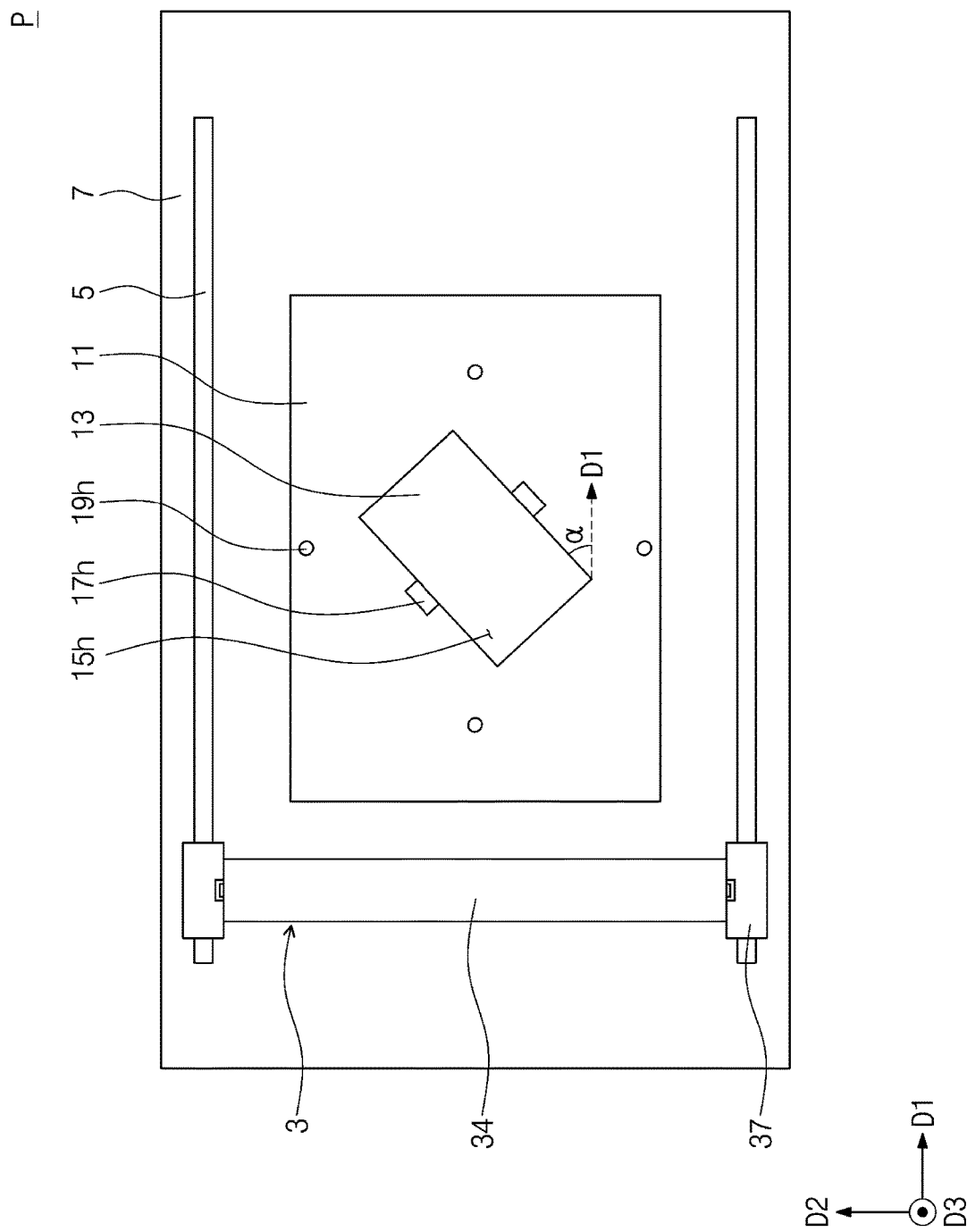
FIG. 15 is a plan (or top down) view illustrating a pellicle transfer apparatus according to embodiments of the inventive concept.
Figure 16:
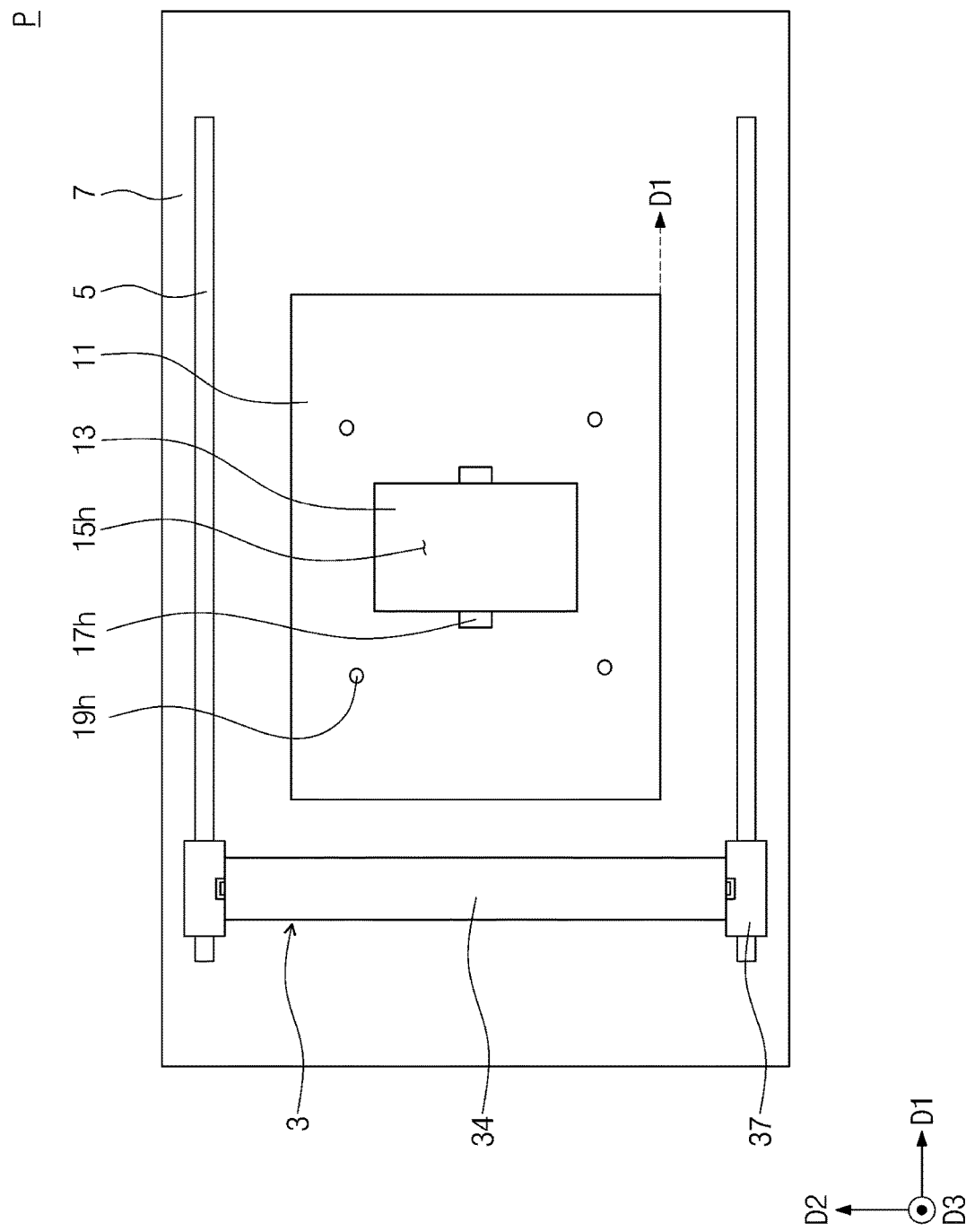
FIG. 16 is a plan view illustrating a pellicle transfer apparatus according to a comparative example.

FIG. 15 is a plan view illustrating a pellicle transfer apparatus according to embodiments of the inventive concept, and FIG. 16 is a plan view illustrating a pellicle transfer apparatus according to a comparative example.

Referring to FIG. 15, one or both of the support member 13 and the disposition hole 15h may be inclined. For example, one or both of the support member 13 and the disposition hole 15h may have sides each of which is not perpendicular to the first direction D1 or the second direction D2. In addition, one or both of the support member 13 and the disposition hole 15h may have sides each of which is not parallel to the first direction D1 or the second direction D2. For example, one or both of the support member 13 and the disposition hole 15h may have sides each of which has an acute angle α relative to the first direction D1. The acute angle α may be, for example, about 45°, however, the inventive concept is not limited thereto.

Referring to FIGS. 8A, 8B, 8C, 8D and 16, one or both of the support member 13 and the disposition hole 15h may have sides each of which is perpendicular or parallel to the first direction D1 and the second direction D2. In this case, when the roller unit 3 moves in the first direction D1, one side of a pellicle on the support member 13 may be compressed a single time by a lower roller. When the one side of the pellicle is compressed a single time, it may be possible to damage to the thin fragile pellicle. For example, when the one side of the pellicle is compressed a single time, it may not be easy to uniformly compress an entirety of the one side of the pellicle. When the entirety of the one side of the pellicle is not uniformly compressed, the thin fragile pellicle may become damaged.

In contrast, referring to FIGS. 8A, 8B, 8C, 8D and 15, each side of the support member 13 and/or of the disposition hole 15h may have an acute angle α relative to the first direction D1. Therefore, the pellicle 4 may also be inclined on the support member 13. In this case, when the roller unit 3 moves in the first direction D1, the lower roller 31 may begin to compress a vertex at one side of the pellicle 4. Therefore, possible damage to the pellicle 4 may be prevented. For example, the lower roller 31 may first compress the vertex at one side of the pellicle 4 and then may progressively compress two sides extending from the vertex at one side of the pellicle 4. In this case, it may be possible to uniformly compress the pellicle 4 and prevent damage to the pellicle 4.

In pellicle transfer apparatuses and methods according to embodiments of the inventive concept, the pellicle may be transferred from the flexible plate onto the target plate. For example, the pellicle may be attached to the target plate. Compression and adhesion processes using multiple rollers may transfer the pellicle from the flexible plate onto the target plate with markedly reduced risk of damage to the pellicle. Accordingly, it may be possible to increase process yield for pellicle transfer processes using embodiments of the inventive concept.

The pellicle transfer apparatuses and methods according to certain embodiments of the inventive concept may stably transfer a pellicle using a target plate having an open frame shape.

Figure 17:
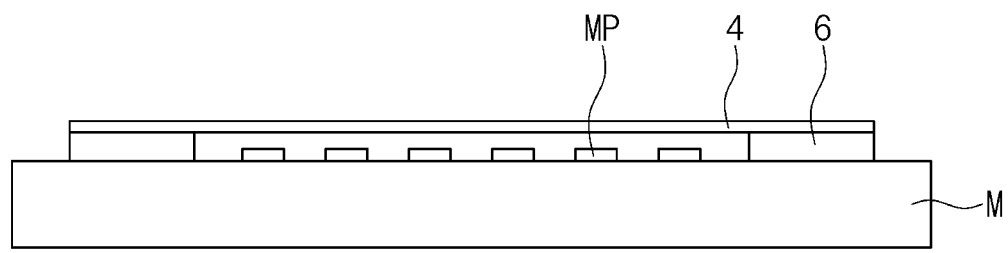
FIG. 17 is a cross-sectional view illustrating the use of a pellicle placed by a pellicle transfer apparatus according to embodiments of the inventive concept.

FIG. 17 is a cross-sectional view illustrating one possible use of a pellicle placed by a pellicle transfer apparatus according to embodiments of the inventive concept.

Referring to FIG. 17, a pattern MP is associated with a photomask M. The target plate 6 may be coupled to the photomask M, and the target plate 6 may fix the pellicle 4 to the photomask M. Once placed, the pellicle 4 may protect the pattern MP of the photomask M from contamination and/or damage.

Figure 18:
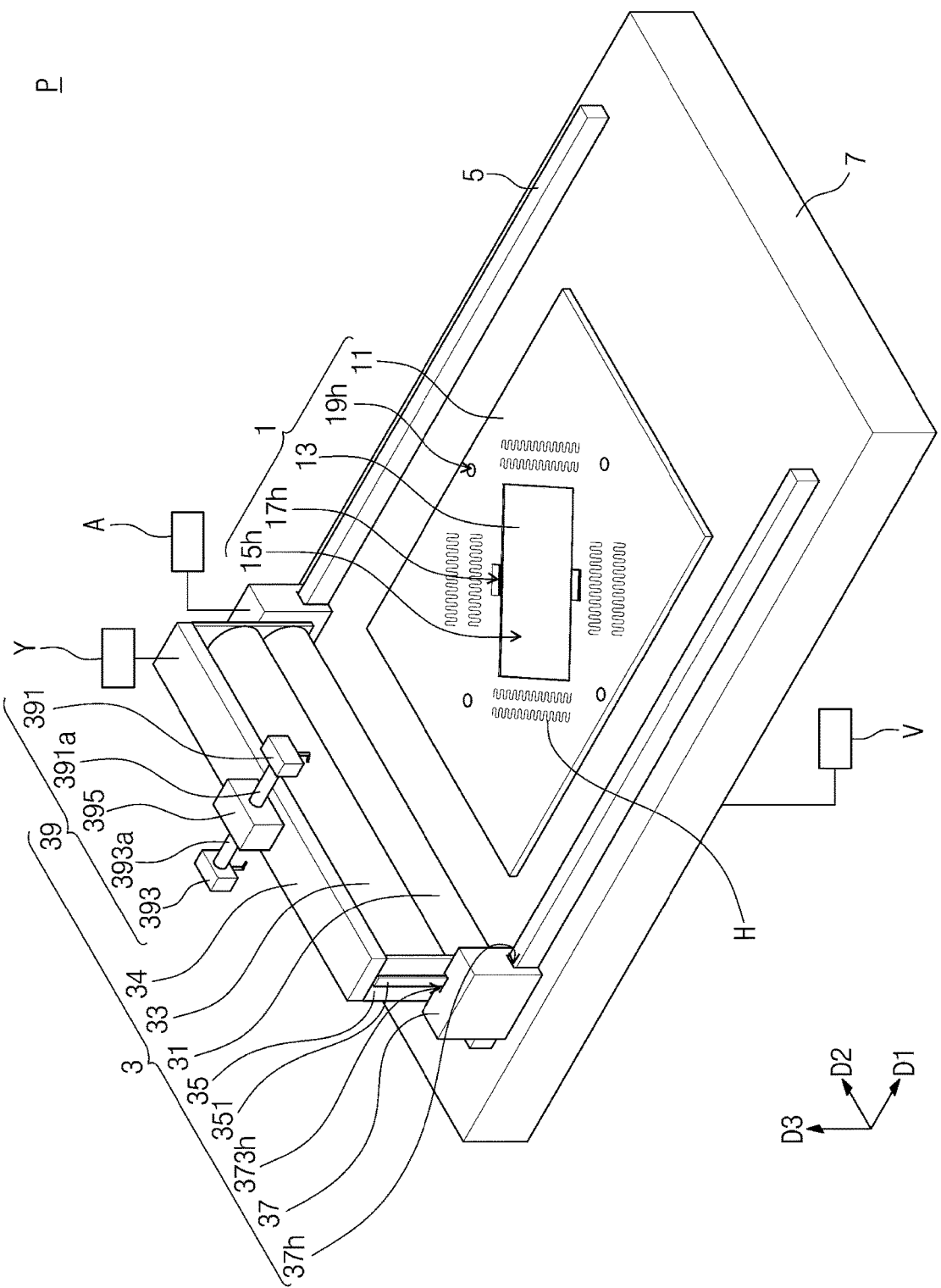
FIG. 18 is a perspective view illustrating a pellicle transfer apparatus according to embodiments of the inventive concept.

FIG. 18 is a perspective view illustrating a pellicle transfer apparatus according to embodiments of the inventive concept.

Referring to FIG. 18, the base 1 may further include (optionally) a hot wire H. For example, the hot wire H may be included in the body 11 of the base 1. The hot wire H may be supplied with energy from a power source (not shown). When the hot wire H is supplied with energy from the power source, the hot wire H heats up and applies thermal energy to the top surface of the body 11. In this manner, the body 11 may increase the temperature of the top surface, thereby accelerating evaporation any residual solvent and further reducing the chances of sliding and damage between components.

Figure 19:
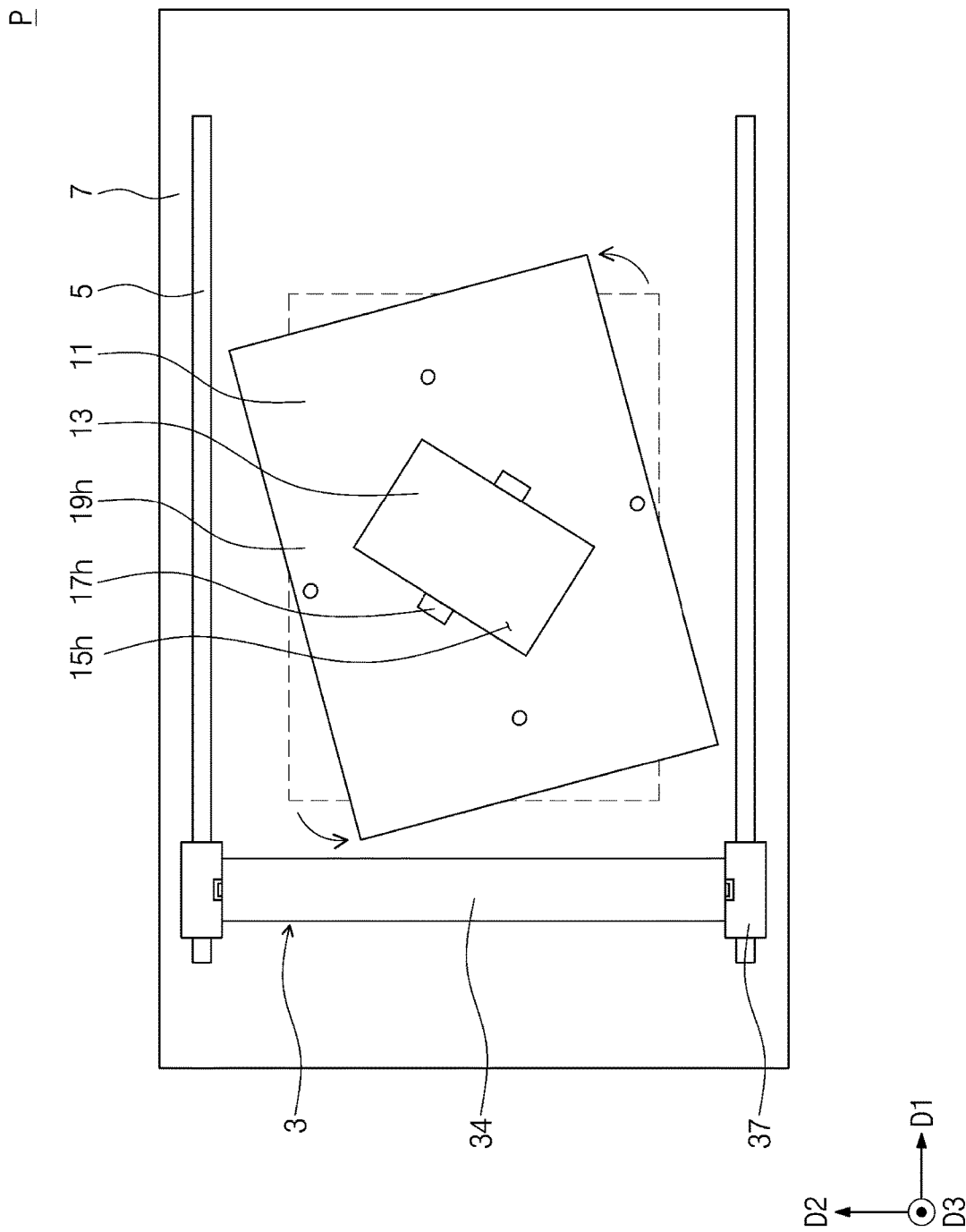
FIG. 19 is a plan view illustrating a pellicle transfer apparatus according to embodiments of the inventive concept.

FIG. 19 is a plan view illustrating a pellicle transfer apparatus according to embodiments of the inventive concept.

Referring to FIG. 19, a rotatable base 1 may be used. For example, the base 1 may rotate about a normal line to the top surface (i.e., a vertical line intersecting a point on the top surface). The lower body 7 may include a separate mechanism for the rotation of the base 1. For example, the lower body 7 may include therein a drive mechanism for the rotation of the base 1. Alternately, the drive unit A of FIG. 1 may be used to rotate the base 1. When the base 1 rotates on the lower body 7, each side of the disposition hole 15h and/or of the support member 13 may be aligned with desired (and variable) angles. Therefore, the transfer process may be performed while the pellicle is disposed at various angles. The transfer process may be executed at various angles according to the material(s) and thickness of the pellicle, the flexible plate, and the target plat, for example. Accordingly, it may be possible to determine specific angle(s) maximizing yield for various pellicle transfer process(es).

As has been described above, embodiments of the inventive concept provide pellicle transfer apparatuses and methods capable of transferring very thin pellicles without damage. Embodiments of the inventive concept provide pellicle transfer apparatuses and methods capable of stably transferring a pellicle onto an open frame (or hollow type) target plate. Embodiments of the inventive concept provide pellicle transfer apparatuses and methods concept capable of increasing yield of pellicle transfer processes.

Although the inventive concept have been described in connection with the embodiments of the inventive concept illustrated in the accompanying drawings, it will be understood to those skilled in the art that various changes and modifications may be made without departing from the technical spirit and essential feature of the inventive concept. It therefore will be understood that the embodiments described above are just illustrative but not limitative in all aspects.

What is claimed is:

1. A pellicle transfer apparatus, comprising:
   a base including a body with a disposition hole and a support member in the disposition hole; and
   a roller unit laterally movable in a first direction across the base, and including a lower roller extending in a second direction intersecting the first direction, and an upper roller above the lower roller and extending in the second direction,
   wherein the support member is up/down movable in the disposition hole.

2. The pellicle transfer apparatus of claim 1, wherein a top surface of the support member is exposed by the disposition hole and disposed below a top surface of the body.

3. The pellicle transfer apparatus of claim 1, further comprising:
   a guide rail extending in the first direction,
   wherein the roller unit further includes a guide member connected to the lower roller and the upper roller and movable in the first direction along the guide rail to allow the roller unit to laterally move in the first direction.

4. The pellicle transfer apparatus of claim 3, further comprising:
   a vertical drive unit configured to up/down drive the roller unit,
   wherein the roller unit further includes a connection member connecting the lower roller and the upper roller, the guide member is connected through the connection member to the lower roller and the upper roller, and the connection member is mechanically associated with the guide member, such that the connection member is up/down movable with respect to the guide member.

5. The pellicle transfer apparatus of claim 1, wherein a top surface of the body includes a vacuum hole connected to a vacuum pump.

6. The pellicle transfer apparatus of claim 1, wherein the support member has a rectangular shape, and each side of the support member has an acute angle relative to the first direction.

7. The pellicle transfer apparatus of claim 6, wherein the body includes at least one extension hole downwardly recessed from a top surface of the body and disposed on a lateral surface of the support member.

8. The pellicle transfer apparatus of claim 1, further comprising an absorbent layer on a top surface of the body.

9. The pellicle transfer apparatus of claim 1, wherein the base further includes a hot wire in the body.

10. The pellicle transfer apparatus of claim 1, wherein the roller unit further includes a camera mounted above the upper roller.

11. The pellicle transfer apparatus of claim 1, wherein the base is rotatable about a normal line to a top surface of the base.

12. A pellicle transfer apparatus, comprising:
a base supporting a target plate, a pellicle and a flexible plate sequentially stacked on the base; and
a roller unit laterally movable in a first direction across the base and including a lower roller extending in a second direction intersecting the first direction, and an upper roller above the lower roller and extending in the second direction,
wherein the lower roller is configured to directly adhere to and compress the flexible plate while the roller unit laterally moves in the first direction across the base to bond the pellicle to the target plate, as the pellicle is separated from the flexible plate, and the lower roller is further configured to rotate to lift the flexible plate upward to wrap the flexible plate around the lower roller, and
the upper roller is configured to contact the flexible plate as it wraps around the lower roller.

13. The pellicle transfer apparatus of claim 12, wherein the base includes a body with a disposition hole and a support member in the disposition hole, and the target plate is disposed on the support member.

14. A pellicle transfer method, comprising:
placing a target plate on a base;
placing a flexible plate having a pellicle attached to a bottom surface of the flexible plate to cover the target plate; and
moving a roller unit, including a lower roller and an upper roller above the lower roller, in a first direction across the base, such that the lower roller compresses the flexible plate to bond the pellicle to the target plate, as the pellicle separates from the flexible plate and the flexible plate moves upward to wrap around the lower roller, and the upper roller contacts the flexible plate as it wraps around the lower roller.

15. The pellicle transfer method of claim 14, wherein a top surface of the base includes at least one vacuum hole, and the placing of the flexible plate having the pellicle attached to the bottom surface of the flexible plate to cover the target plate includes:
applying vacuum pressure through the at least one vacuum hole to fix the flexible plate to the base.

16. The pellicle transfer method of claim 15, wherein the at least one vacuum hole includes a plurality of vacuum holes, and the applying of the vacuum pressure through the at least one vacuum hole to fix the flexible plate to the base includes applying the vacuum pressure to each vacuum hole in the plurality of vacuum holes, and the pellicle transfer method further comprises:
stopping the applying of the vacuum pressure provided to the plurality of vacuum holes as soon as the lower roller passes over one of the plurality of vacuum holes.

17. The pellicle transfer method of claim 14, wherein the base includes a body having a disposition hole and a support member in the disposition hole, and the placing of the target plate on the base includes positioning the target plate on the support member.

18. The pellicle transfer method of claim 17, wherein the support member is up/down movable in the disposition hole, and
before the placing of the target plate on the base, adjusting a height of the support member.

19. The pellicle transfer method of claim 14, further comprising:
before the placing of the target plate on the base, positioning an absorbent layer on the base.

* * * * *